United States Patent
Shindo et al.

(10) Patent No.: US 12,440,971 B2
(45) Date of Patent: Oct. 14, 2025

(54) APPARATUS FOR TRANSPORTING SUBSTRATE, SYSTEM FOR PROCESSING SUBSTRATE, AND METHOD OF TRANSPORTING SUBSTRATE

(71) Applicant: TOKYO ELECTRON LIMITED, Tokyo (JP)

(72) Inventors: Takehiro Shindo, Yamanashi (JP); Akira Takahashi, Iwate (JP); Takashi Horiuchi, Yamanashi (JP); Toshiaki Kodama, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 971 days.

(21) Appl. No.: 17/554,343

(22) Filed: Dec. 17, 2021

(65) Prior Publication Data

US 2022/0193897 A1 Jun. 23, 2022

(30) Foreign Application Priority Data

Dec. 18, 2020 (JP) ................................. 2020-210561

(51) Int. Cl.

| B25J 9/16 | (2006.01) |
|---|---|
| B25J 11/00 | (2006.01) |
| B25J 13/08 | (2006.01) |
| B25J 15/00 | (2006.01) |
| B25J 17/02 | (2006.01) |
| B25J 19/00 | (2006.01) |
| H01L 21/687 | (2006.01) |

(52) U.S. Cl.
CPC .......... *B25J 9/1628* (2013.01); *B25J 11/0095* (2013.01); *B25J 13/088* (2013.01); *B25J 15/0014* (2013.01); *B25J 17/0275* (2013.01); *H01L 21/68707* (2013.01); *B25J 19/0083* (2013.01)

(58) Field of Classification Search
CPC .. B25J 11/0095; B25J 13/088; B25J 15/0014; B25J 17/0275; B25J 19/0083; B25J 9/042; B25J 9/1628; H01L 21/67742; H01L 21/68707
See application file for complete search history.

(56) References Cited

U.S. PATENT DOCUMENTS

| 7,572,742 B2 | 8/2009 | Hiroki |
| 10,483,142 B1 * | 11/2019 | Tan .................. H01L 21/68707 |
| 2007/0275486 A1 | 11/2007 | Hiroki |

(Continued)

FOREIGN PATENT DOCUMENTS

| JP | S51-47171 U | 4/1976 |
| JP | 2004-264053 A | 9/2004 |

(Continued)

*Primary Examiner* — Wade Miles
*Assistant Examiner* — Zachary Joseph Wallace
(74) *Attorney, Agent, or Firm* — Fenwick & West LLP

(57) ABSTRACT

There is provided an apparatus for transporting a substrate. The apparatus comprises: an end effector including a fork which holds the substrate and a wrist part which holds a proximal end portion of the fork; an arm provided with the end effector installed thereon and a mechanism which moves the fork; and an inclination adjusting mechanism provided between the fork and the wrist part or between the wrist part and the arm to adjust an inclination of the fork.

18 Claims, 15 Drawing Sheets

(56) References Cited

U.S. PATENT DOCUMENTS

| | | | | |
|---|---|---|---|---|
| 2013/0287529 A1* | 10/2013 | Yang | ............ | H01L 21/68742 |
| | | | | 269/14 |
| 2017/0040204 A1* | 2/2017 | Kim | ............ | H01L 21/67167 |
| 2020/0381276 A1* | 12/2020 | Yedla | ............ | B25J 15/0052 |
| 2021/0381101 A1* | 12/2021 | Nanjundappa | ...... | H01L 21/6719 |

FOREIGN PATENT DOCUMENTS

| | | | |
|---|---|---|---|
| JP | 2005-286211 A | 10/2005 |
| JP | 2007-035669 A | 2/2007 |
| JP | 2007-061920 A | 3/2007 |
| JP | 2009-012107 A | 1/2009 |

* cited by examiner

APPARATUS FOR TRANSPORTING SUBSTRATE, SYSTEM FOR PROCESSING SUBSTRATE, AND METHOD OF TRANSPORTING SUBSTRATE

CROSS-REFERENCE TO RELATED APPLICATIONS

This application claims priority to Japanese Patent Application No. 2020-210561 filed on Dec. 18, 2020, the entire contents of which are incorporated herein by reference.

TECHNICAL FIELD

The present disclosure relates to an apparatus for transporting a substrate, a system for processing a substrate, and a method of transporting a substrate.

BACKGROUND

A transport apparatus for transporting a semiconductor wafer (hereinafter, referred to as a wafer), which is a substrate for manufacturing a semiconductor device, used in production of a semiconductor device is configured such that a fork for holding the wafer is movable. As a technique for adjusting an inclination of the fork, Japanese Patent Application Publication No. 2007-61920 proposes a mechanism for adjusting loosely hanging of the fork according to an installation angle.

SUMMARY

The present disclosure provides a technology capable of adjusting an inclination of a fork.

In accordance with an aspect of the present disclosure, there is provided an apparatus for transporting a substrate. The apparatus comprises: an end effector including a fork which holds the substrate and a wrist part which holds a proximal end portion of the fork; an arm provided with the end effector installed thereon and a mechanism which moves the fork; and an inclination adjusting mechanism provided between the fork and the wrist part or between the wrist part and the arm to adjust an inclination of the fork. The inclination adjusting mechanism includes: three support pins provided to support the fork or the wrist part from a lower surface side and disposed at positions at which vertices of a triangle are formed when seen in a plan view, a height adjusting part which changes height positions of upper ends of the three support pins relative to each other, and a pulling pin disposed inside the triangle to maintain a state in which the upper end of each of the support pins and the lower surface of the fork or the wrist part are in contact with each other, and installed to pull the fork toward a support pin side.

DETAILED DESCRIPTION

<Processing System>

Figure 1:
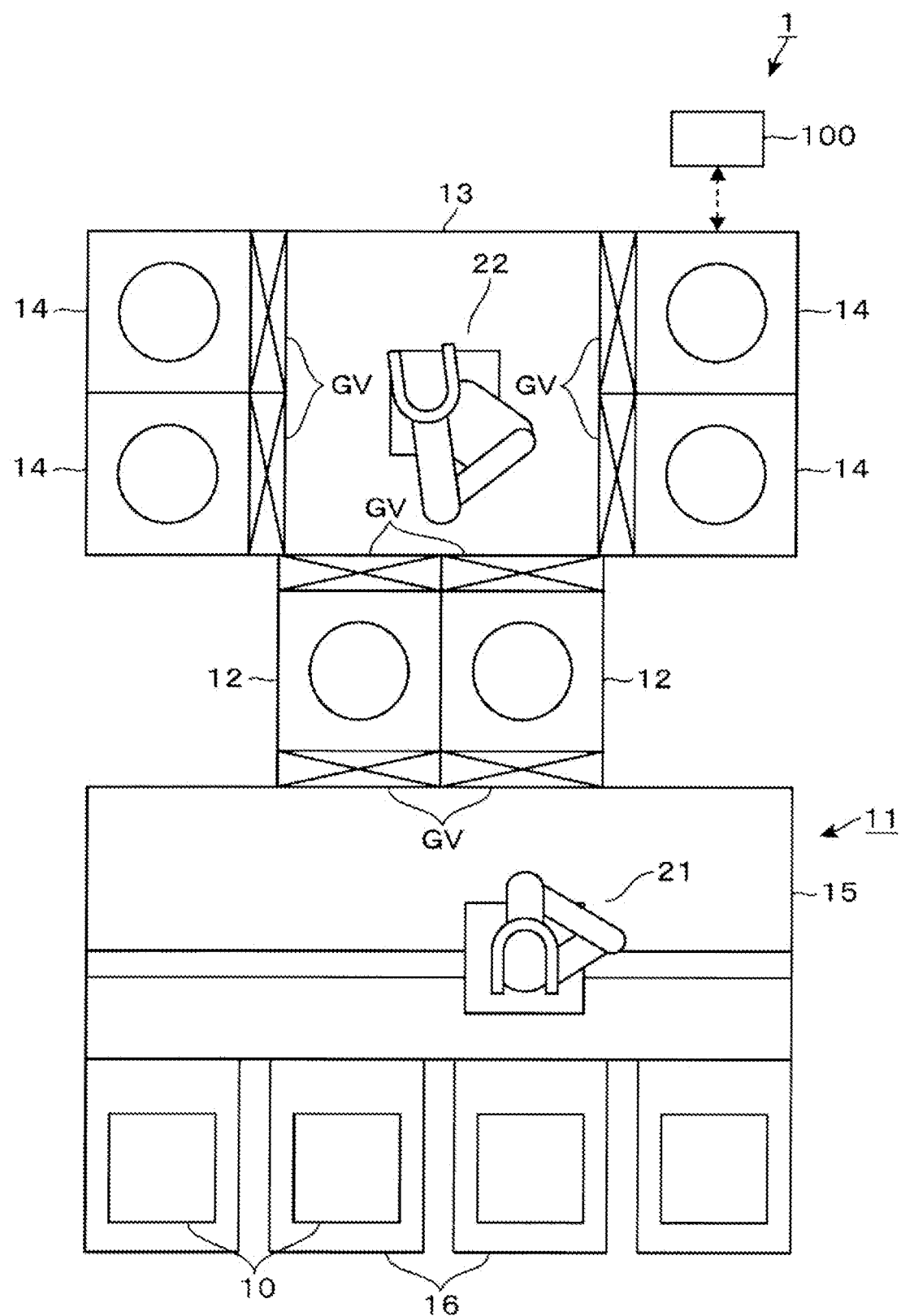
FIG. 1 is a schematic plan view illustrating a processing system according to an embodiment.

An embodiment of a system for processing a wafer which is a substrate of the present disclosure (hereinafter, referred to as a "processing system") will be described with reference to FIG. 1. FIG. 1 is a schematic plan view illustrating a configuration example of the processing system 1. The processing system 1 includes a load module 11 which performs loading and unloading of a wafer that is a substrate, a load lock chamber 12, a vacuum transport chamber 13, and a plurality of, e.g., four, vacuum processing chambers 14. The load module 11 includes an atmospheric transport chamber 15 in which a wafer is transported by an atmospheric transport mechanism 21 and includes a plurality of, e.g., four, load ports 16 to which a container 10 (for example, front opening unified pod (FOUP)) accommodating a plurality of wafers is connected. Further, for example, two load lock chambers 12 are connected to the atmospheric transport chamber 15, and the wafer is transported between the container 10 on the load port 16 and the load lock chamber 12 by the atmospheric transport mechanism 21. In FIG. 1, a symbol GV refers to a gate valve.

The two load lock chambers 12 are connected to each of the atmospheric transport chamber 15 and the vacuum transport chamber 13, and the inside of the two load lock chambers 12 is configured to be adjustable between atmospheric pressure atmosphere and vacuum pressure atmosphere. The vacuum transport chamber 13 is maintained at a predetermined degree of vacuum and includes a vacuum transport mechanism 22 which transports a wafer between the load lock chamber 12 and each of the vacuum processing chambers 14. The vacuum processing chamber 14 is a processing chamber which accommodates the wafer therein and processes the wafer and is configured so that the wafer mounted on a mounting table in the vacuum processing chamber 14 is subjected to processing such as etching or film formation in a vacuum environment. Each of the vacuum processing chambers 14 may be modules which perform the same process in a manufacturing process or may be modules which perform different processes.

The processing system 1 includes a control part 100 which is a computer, and the control part 100 has a program. This program is stored in a storage medium such as a compact disk, a hard disk, a magneto-optical disk, or a digital versatile disc (DVD) and is installed in the control part 100. The control part 100 outputs a control signal to each of parts of the processing system 1 using the program and controls an operation of each of parts. Specifically, this program controls operations such as wafer transport by a substrate transport apparatus 2 described below in the processing system 1 and vacuum processing for the wafer in each of the vacuum processing chambers 14. Then, according to the program, a group of steps is set up so that an operation of adjusting an inclination of the fork of the substrate transport apparatus 2 described below or teaching can be performed.

A wafer transport path in the processing system 1 will be briefly described. First, the atmospheric transport mechanism 21 takes an unprocessed wafer out of the container 10 connected to the load port 16 and transports the wafer to the load lock chamber 12 in an atmospheric pressure atmosphere. Next, after the load lock chamber 12 is set to a predetermined degree of vacuum, the wafer is unloaded from the load lock chamber 12 by the vacuum transport mechanism 22 and transported to a certain vacuum processing chamber 14, and the processing of the wafer is performed in the vacuum processing chamber 14. Subsequently, the processed wafer is transported from the vacuum processing chamber 14 to the load lock chamber 12 set to the degree of vacuum by the vacuum transport mechanism 22. When different processes are performed in the plurality of vacuum processing chambers 14 during the manufacturing process, the wafer may be transported between the plurality of vacuum processing chambers 14 before being transported to the load lock chamber 12. Next, after the inside of the load lock chamber 12 is adjusted to an atmospheric pressure atmosphere, the wafer in the load lock chamber 12 is unloaded by the atmospheric transport mechanism 21 and is transported to the container 10 connected to the load port 16.

The apparatus 2 for transporting a substrate of the present disclosure (hereinafter, referred to as a "substrate transport apparatus") is an apparatus which transports a wafer between a wafer mounting position and the vacuum processing chamber 14 and is configured as at least one of the atmospheric transport mechanism 21 and the vacuum transport mechanism 22. The above-described mounting position is a position at which the wafer before and after being processed in the vacuum processing chamber 14 is mounted. Therefore, when the substrate transport apparatus 2 of the present disclosure is the atmospheric transport mechanism 21, the above-described mounting position corresponds to a position at which the wafer is transported by the atmospheric transport mechanism 21, for example, a position of the container 10 on the load port 16 or a wafer mounting position in the load lock chamber 12. Further, when the substrate transport apparatus 2 of the present disclosure is the vacuum transport mechanism 22, the above-described mounting position corresponds to a location at which the wafer is transported by the vacuum transport mechanism 22, for example, a wafer mounting position in the load lock chamber 12 or a position on the mounting table in each of the vacuum processing chambers 14.

First Embodiment of Substrate Transport Apparatus

Figure 2:
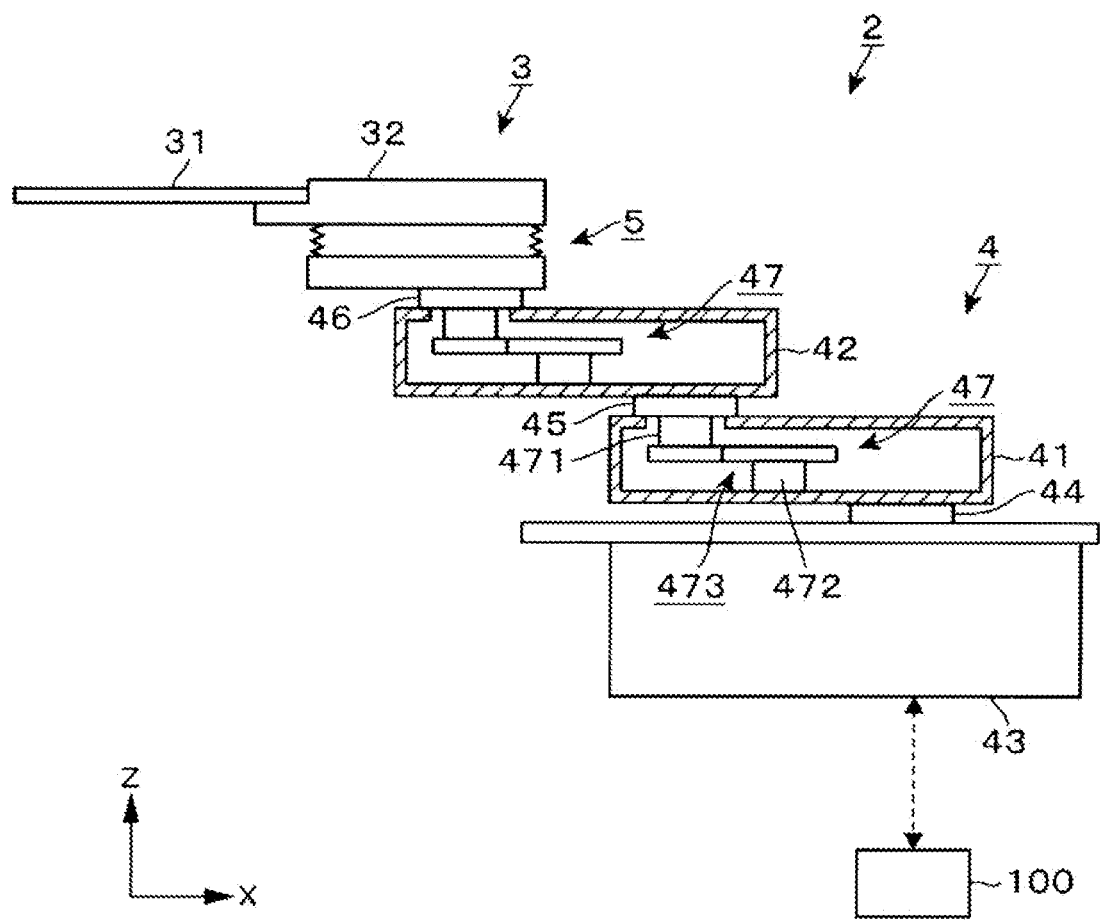
FIG. 2 is a longitudinally sectional side view illustrating a substrate transport apparatus according to the embodiment.
Figure 3A:
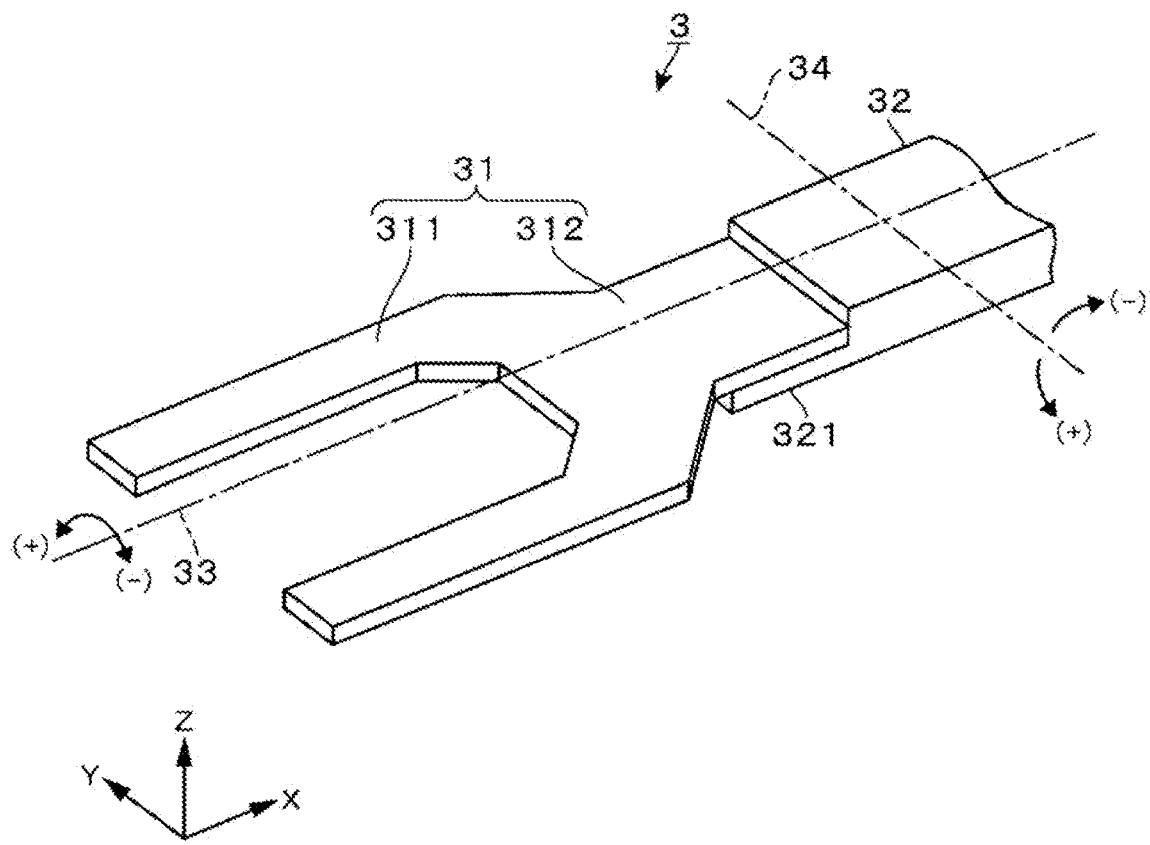
FIG. 3A is a perspective view illustrating a part of an end effector according to the embodiment.
Figure 3B:
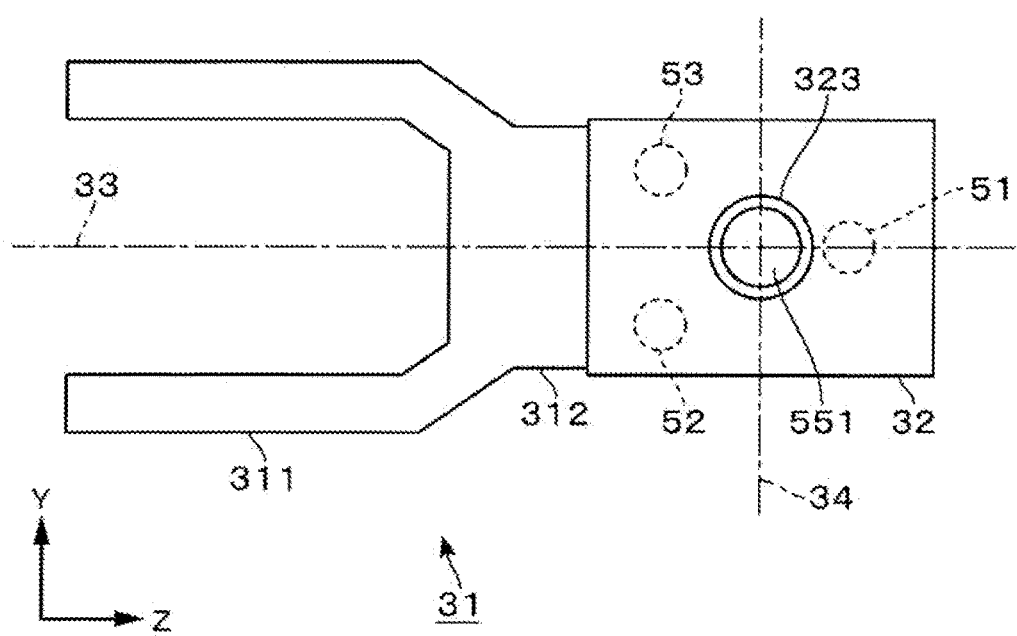
FIG. 3B is a plan view illustrating the end effector.

With reference to FIGS. 2, 3A and 3B, a first embodiment of the substrate transport apparatus 2 will be described by taking an example case in which the first embodiment is applied to the atmospheric transport mechanism 21. The substrate transport apparatus 2 includes an end effector 3, an arm 4, and an inclination adjusting mechanism 5.

As illustrated in the drawings, the end effector 3 includes a fork 31 which holds a wafer, and a wrist part 32 which holds a proximal end portion of the fork 31. The fork 31 in this example includes, for example, a tip end portion 311, which is formed of a plate-like body substantially having a U-shape in a plan view, and a proximal end portion 312, which is connected to the wrist part 32, and is configured so that the wafer is mounted on the tip end portion 311.

The wrist part 32 is formed of, for example, a rectangular plate-like body, which is made of aluminum, in a plan view and is connected to the fork 31 in a state in which the proximal end portion 312 of the fork 31 is mounted on a stepped part 321 formed at a tip end thereof. The fork 31 is installed so that the fork 31 is also horizontal when the wrist part 32 is horizontal. In this example, the fork 31 and the wrist part 32 are made of separate materials, but the fork 31 and the wrist part 32 may be integrally formed.

An X direction illustrated in FIGS. 2, 3A and 3B is a front-rear direction of the end effector 3, a Y direction is a left-right direction of the end effector 3, the tip end side of the end effector 3 is the front side, and the proximal end side of the effector 3 is the rear side. In FIG. 3A, a reference numeral 33 indicates a roll axis, and a reference numeral 34 indicates a pitch axis. The roll axis 33 is a rotation axis when the end effector 3 is inclined in the left-right direction through the center of each of the fork 31 and the wrist part 32 in the left-right direction when the end effector 3 is seen from the front. The pitch axis 34 is a rotation axis which is orthogonal to the roll axis 33 and used when the end effector 3 is inclined in the front-rear direction.

The arm 4 includes a mechanism which is installed on the end effector 3 and moves the fork 31. In this example, the arm 4 has a configuration in which a plurality of arm parts are rotatably connected to each other via a joint part. The plurality of arm parts include a first arm part 41, a second arm part 42, and a base 43. The first arm part 41 is rotatably supported with respect to the base 43 via a first joint part 44. Further, the second arm part 42 is rotatably supported with respect to the first arm part 41 via a second joint part 45. Then, the wrist part 32 of the end effector 3 is connected to the second arm part 42 via an inclination adjusting mechanism 5 and a third joint part 46.

Each of the first joint part 44, the second joint part 45, and the third joint part 46 includes a rotation mechanism 47 (in a longitudinally sectional view of FIG. 2, the rotation mechanism 47 of the second joint part 45 and the third joint part 46 is exemplified). The rotation mechanism 47 is a mechanism for moving the fork 31. The rotation mechanism 47 will be described by taking an example of the second joint part 45, and for example, the rotation mechanism 47 includes a rotating shaft 471 connected to a lower surface of the second arm part 42, a motor 472 which is a driving mechanism, and a gear mechanism 473 which transmits a driving force of the motor 472 to the rotating shaft 471. Due to driving of the motor 472 in this way, the rotating shaft 471 rotates around a vertical axis, and the second arm part 42 is rotatably configured. A similar rotation mechanism is provided in the first joint part 44, the first arm part 41 is rotatably configured, and a similar rotation mechanism 47 is also provided in the third joint part 46, and the end effector 3 is rotatably configured via the inclination adjusting mechanism 5 described below. Further, the substrate transport apparatus 2 includes, for example, an elevating mechanism (not illustrated) which moves the base 43 upward or downward so as to move the end effector 3 upward or downward.

Subsequently, the inclination adjusting mechanism 5 will be described with reference to FIGS. 3B, 4 and 5. The inclination adjusting mechanism 5 in this example is installed between the wrist part 32 and the arm 4 and adjusts an inclination of the fork 31. The inclination adjusting mechanism 5 is installed so as to support the lower surface of the wrist part 32 and includes three support pins 51, 52, and 53 which are disposed at positions at which vertices of a triangle are formed when seen in a plan view. In this example, when seen in a plan view, one of the support pins 51, 52, and 53 is disposed on the roll axis 33, and the remaining two support pins 52 and 53 are disposed at positions symmetrical with each other in the left-right direction with the roll axis 33 interposed therebetween. An upper end of each of the support pins 51 to 53 is formed, for example, in a substantially hemispherical shape.

Figure 4:
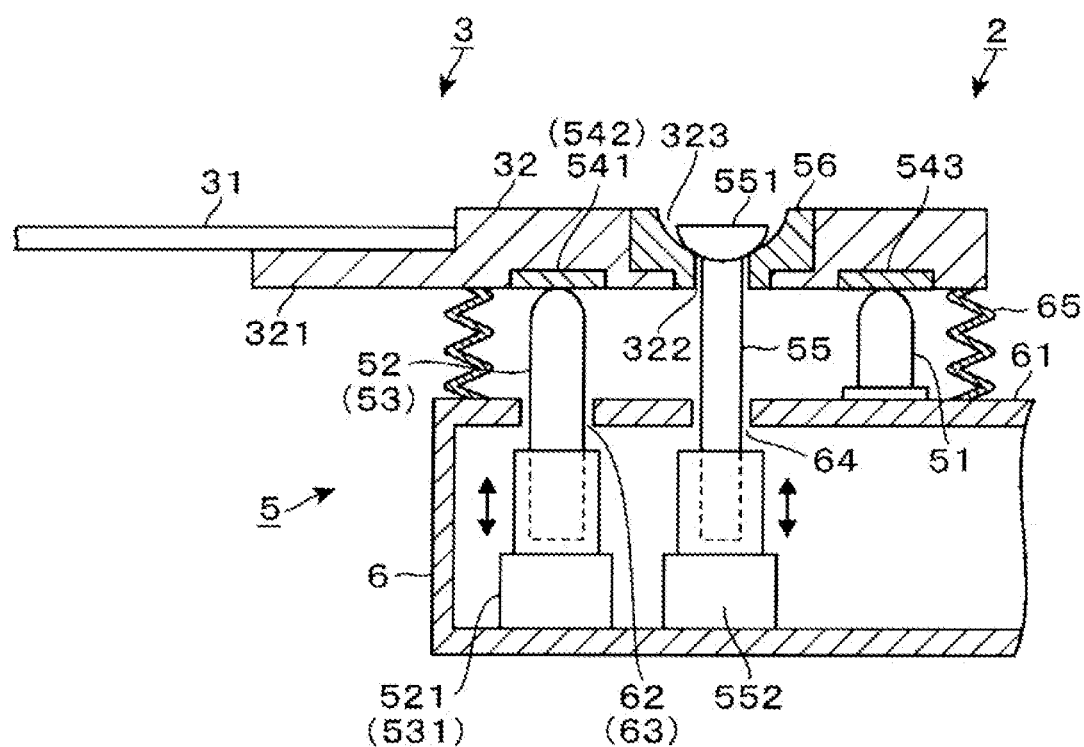
FIG. 4 is a longitudinally sectional side view illustrating the end effector and an inclination adjusting mechanism.
Figure 5:
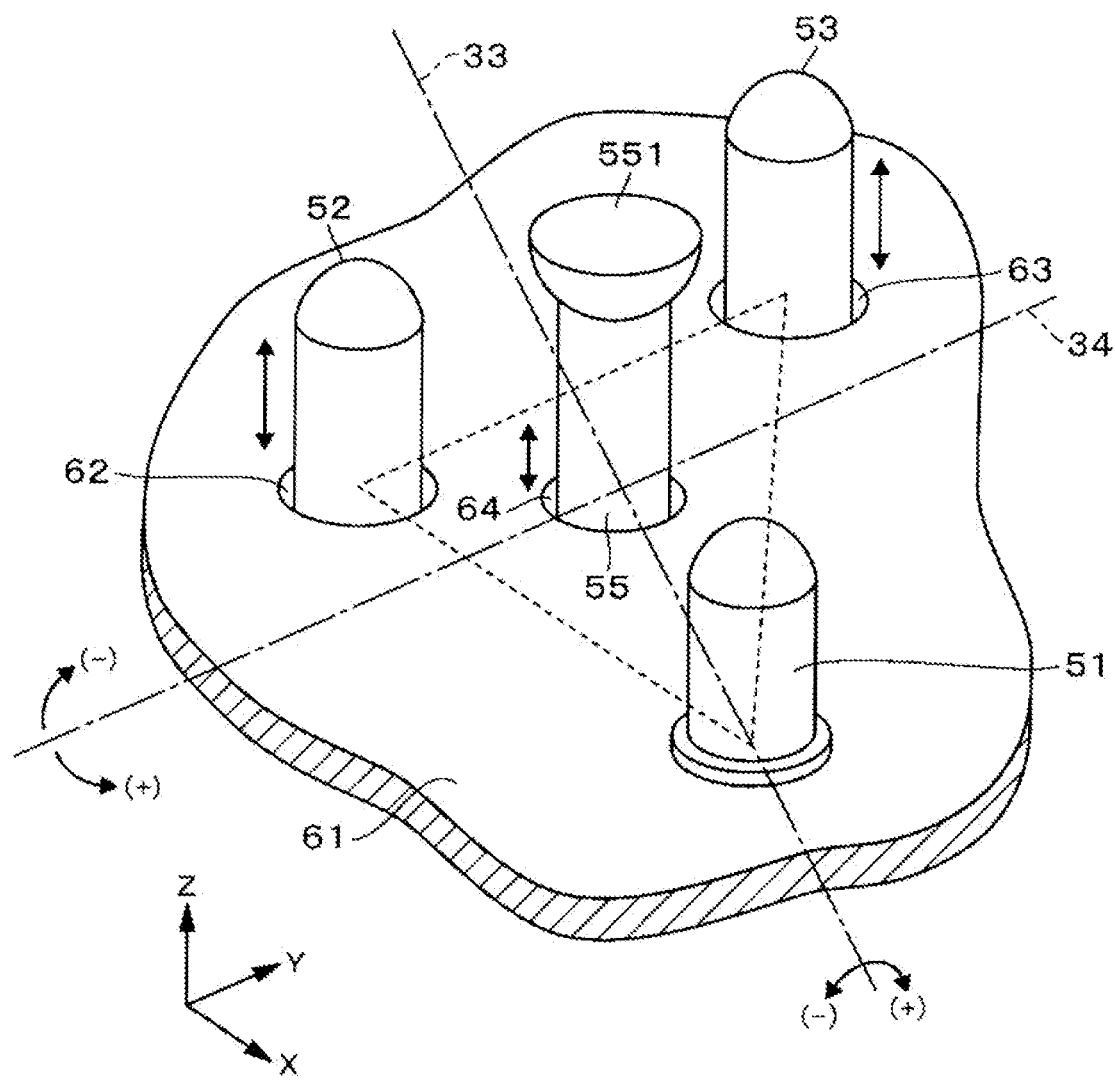
FIG. 5 is a perspective view illustrating a part of the inclination adjusting mechanism.

As illustrated in FIG. 4, the lower end sides of the support pins 52 and 53 are connected to elevating mechanisms 521 and 531. Each of the elevating mechanisms 521 and 531 corresponds to a height adjusting part and is configured as, for example, a cylinder motor. In this way, height positions of the upper ends of the three support pins 51, 52, and 53 including the fixed support pin 51 can be changed relative to each other by changing height positions of upper ends of the two support pins 52 and 53 disposed on the front side. On the lower surface of the wrist part 32 supported by the support pins 51, 52, and 53, for example, plate-like constituent members 541, 542, and 543 are installed in a region in which the upper ends of the support pins 51, 52, 53 are in contact therewith. The constituent members 541 to 543 are made of, for example, stainless steel and are configured to be replaceable.

A housing 6 is installed at the lower side of the wrist part 32, and the elevating mechanisms 521 and 531 are disposed in the housing 6. The housing 6 constitutes a part of the arm 4. A top plate 61 of the housing 6 is installed to horizontally face the wrist part 32. The support pins 52 and 53 connected to the elevating mechanisms 521 and 531 are installed to move upward or downward through through holes 62 and 63 formed in the top plate 61. On the other hand, the support pin 51 is connected to an upper surface of the top plate 61 of the housing 6 and is configured as a fixing pin of which a height position of an upper end does not change.

As described above, in this example, the three support pins 51, 52, and 53 are configured of two elevating pins which are movable upward or downward independently of each other by the elevating mechanisms 521 and 531, and one fixing pin of which a height position of an upper end is fixed.

Since the support pin 52 and the support pin 53 are installed as the elevating pins, and the support pin 51 is installed as the fixing pin, the support pins may be referred to as elevating pins 52 and 53 and a fixing pin 51 hereafter.

Further, the inclination adjusting mechanism 5 includes a pulling pin 55. The pulling pin 55 is installed to pull the fork 31 toward the support pin 51, 52, and 53 in order to maintain a state in which the upper ends of the support pins 51, 52, and 53 are in contact with the lower surface of the wrist part 32. The pulling pin 55 is disposed inside a triangle formed by the three support pins 51, 52, and 53 when seen in a plan view. In this example, as illustrated in FIGS. 3B and 5, the pulling pin 55 is disposed at an intersection of the roll axis 33 and the pitch axis 34 in a region inside the triangle when seen in a plan view.

The pulling pin 55 includes a flange-like head part 551 at an upper end portion. For example, the head part 551 is configured such that the lower surface side thereof is substantially formed in a hemispherical shape, and a pin extends downward from a lower end of the head part 551 having the substantially hemispherical shape. On the other hand, in the wrist part 32, a through hole 322 through which the pulling pin 55 passes is formed in a region facing the second arm part 42. Further, an opening part 323 which is connected to the through hole 322 and has an upper surface having a substantially hemispherical shape corresponding to a shape of a lower surface of the head part 551 of the pulling pin 55 is provided in the wrist part 32.

The upper surface of the opening part 323 is coplanar with an upper surface of the wrist part 32 which comes into contact with the lower surface of the head part 551 of the pulling pin 55. In this example, a constituent member 56 in a region with which the pulling pin 55 comes into contact is made of, for example, stainless steel and is configured to be replaceable. Further, the pulling pin 55 in this example is configured to be movable upward or downward by an elevating part 552 so as to change the height position of the upper end of the pulling pin 55 as the elevating pins 52 and 53 move upward or downward. The elevating part 552 is configured of, for example, a cylinder motor.

The elevating part 552 is accommodated inside the housing 6, and the pulling pin 55 moves upward or downward through a through hole 64 of the top plate 61 of the housing 6. Then, the lower surface of the head part 551 is brought into contact with the upper surface of the opening part 323 (the upper surface of the wrist part 32) formed in the wrist part 32, and pulling-down is performed by the elevating part 552. Shapes of the head part 551 and the opening part 323 are set to be hemispherical so that the pulling-down of the pulling pin 55 can be performed even in a state in which the lower surface of the wrist part 32 is inclined with respect to the top plate 61 of the housing 6.

Further, the inclination adjusting mechanism 5 includes a stretchable bellows 65 provided to connect the wrist part 32 to the arm 4. As illustrated in FIG. 4, the bellows 65 of this example is provided between the lower surface of the wrist part 32 and the top plate 61 of the housing 6 to surround a region in which the support pins 51 to 53 and the pulling pin 55 are installed. Since the housing 6 constitutes a part of the arm 4 as described above, it can be said that the bellows 65 is provided to connect the wrist part 32 to the arm 4.

Since a region in which the support pins 51 to 53 and the pulling pin 55 move upward or downward is divided by providing the bellows 65 in this way, it is possible to prevent particles from being mixed into the region. Further, for example, a component contained in a film formed on a surface of a wafer by a film forming process may react with moisture in the atmospheric transport chamber 15 and may generate a corrosive gas. Even when such a corrosive gas is generated, the intrusion of the corrosive gas into the region in which the support pin 51 or the like moves upward or downward is suppressed, and contact between the support pin 51 or the like and the corrosive gas can be suppressed.

The substrate transport apparatus 2 is configured so that the control part 100 controls a movement operation of the fork 31 due to the arm 4 and an operation of adjusting the inclination of the fork 31 due to the inclination adjustment mechanism 5.

Subsequently, the adjustment of the inclination of the fork 31 due to the inclination adjusting mechanism 5 will be described with reference to FIGS. 6A, 6B, 6C, and 6D. In the drawings, the wrist part 32 and the housing 6 are simplified.

Figure 6A:
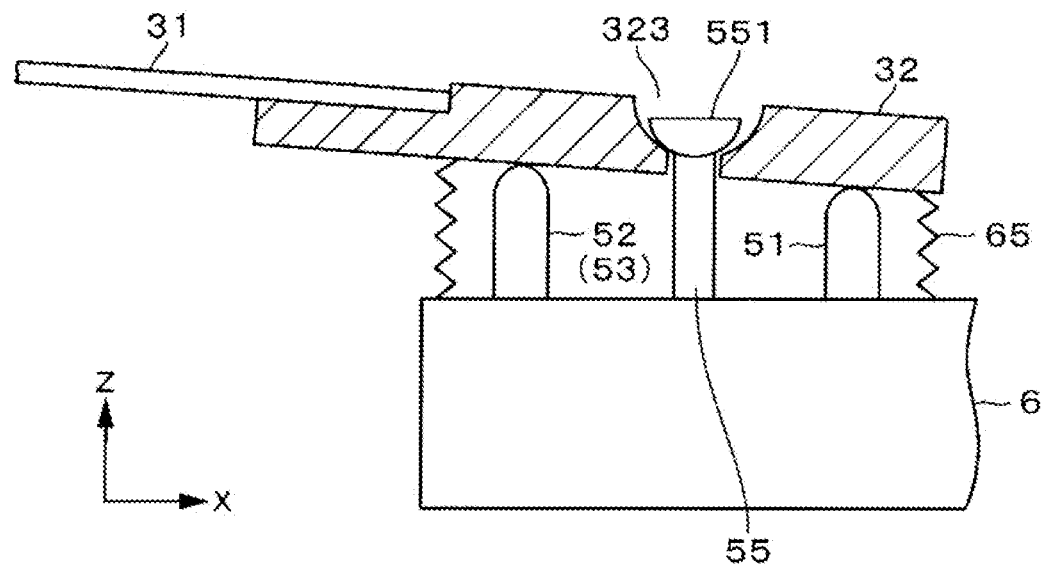
FIG. 6A is a longitudinally sectional side view illustrating an operation of the inclination adjusting mechanism.
Figure 6B:
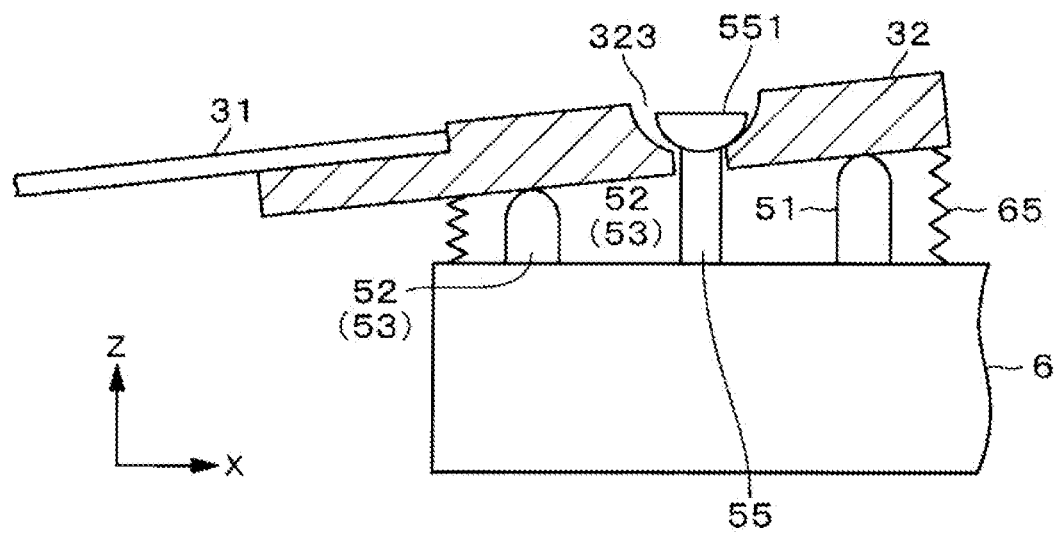
FIG. 6B is a longitudinally sectional side view illustrating the operation of the inclination adjusting mechanism.

FIGS. 6A and 6B show an example in which the wrist part 32 rotates around the pitch axis 34 and the fork 31 is inclined in the front-rear direction. FIG. 6A is an example in which the inclination is adjusted so that the height position on the tip end side of the fork 31 is higher than that on the proximal end side thereof. In this case, the height positions of the upper ends of the elevating pins 52 and 53 are set to be arranged with each other at a position higher than the height position of the upper end of the fixing pin 51. FIG. 6B is an example in which the inclination is adjusted so that the height position on the tip end side of the fork 31 is lower than that on the proximal end side. In this case, the height positions of the upper ends of the elevating pins 52 and 53 are set to be arranged with each other at a position lower than the height position of the upper end of the fixing pin 51.

Figure 6C:
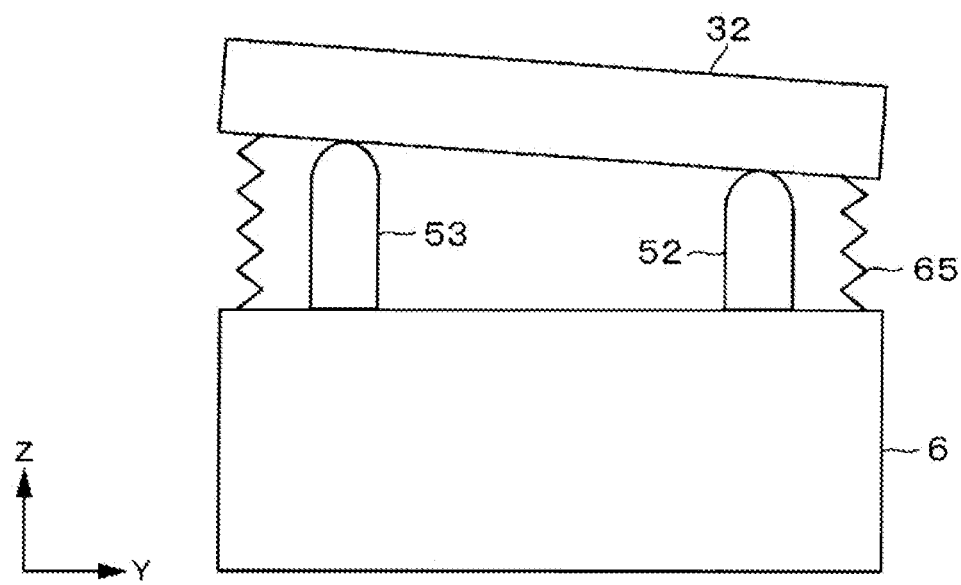
FIG. 6C is a longitudinally sectional side view illustrating the operation of the inclination adjusting mechanism.
Figure 6D:
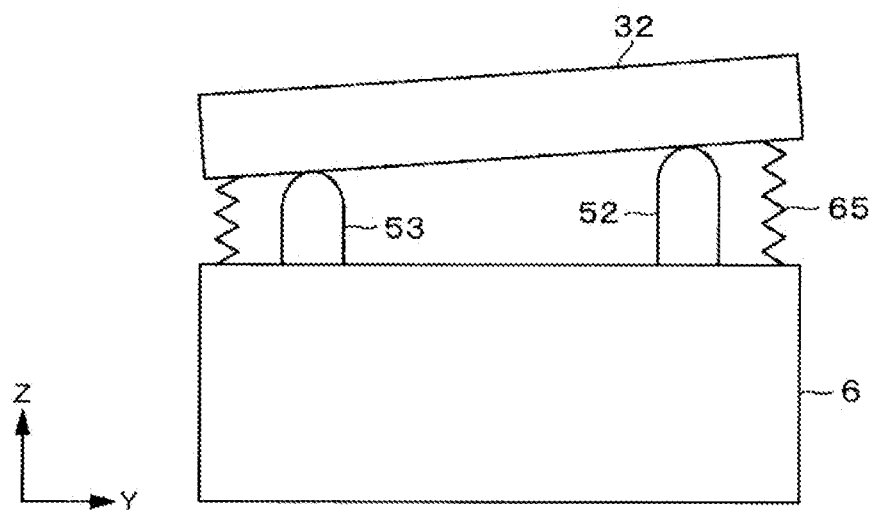
FIG. 6D is a longitudinally sectional side view illustrating the operation of the inclination adjusting mechanism.

FIGS. 6C and 6D show an example in which the wrist part 32 rotates around the roll axis 33 and the fork 31 is inclined in the left-right direction. FIG. 6C is an example in which the inclination is adjusted so that the height position on the left side when seen from the front of the fork 31 is higher than that on the right side, and in this case, the height position of the upper end of the elevating pin 53 is set to a position higher than the height position of the upper end of the elevating pin 52. FIG. 6D is an example in which the inclination is adjusted so that the height position on the left side when seen from the front of the fork 31 is lower than that on the right side, and in this case, the height position of the upper end of the elevating pin 53 is set to a position lower than the height position of the upper end of the elevating pin 52.

Further, the fork 31 may be inclined diagonally in a direction which is not along the axes 34 and 33 by combining the rotation around each of the pitch axis 34 and the roll axis 33.

In the inclination adjusting mechanism 5, the elevating pins 52 and 53 act as push screws for pushing up the lower surface of the wrist part 32 upward, and the pulling pin 55 acts as a pulling screw for pulling the wrist part 32 toward the elevating pin 52 and the like. Therefore, when the inclination of the fork 31 is adjusted by the inclination adjusting mechanism 5, the lower surface of the wrist part 32 is maintained in a state of being in contact with the upper end of each of the elevating pins 52 and 53 and the fixing pins 51. Therefore, a posture of the fork 31 after the inclination is adjusted can be stably maintained. Further, as illustrated in FIGS. 6A to 6D, since the upper ends of the elevating pins 52 and 53 and the fixing pin 51 are formed in a substantially hemispherical shape, even when the wrist part 32 is inclined with respect to the housing 6, the state in which the upper ends of the elevating pin 52 and the like are in contact with the lower surface of the wrist part 32 can be maintained.

The height position of the pulling pin 55 changes according to the height position of the elevating pins 52 and 53, and thus even when the height positions of the elevating pins 52 and 53 change, the pulling pin 55 can be pulled downward by the elevating part 552. For example, the pulling pin 55 is configured to be pulled downward by the elevating part 552 with a constant force so that the upper ends of the elevating pins 52 and 53 are always in contact with the lower surface of the wrist part 32 even when the height positions of the elevating pins 52 and 53 change.

Further, the height position of the pulling pin 55 may be controlled together with the other elevating pins 52 and 53. In this case, for example, corresponding data in which the height position of the upper end of the elevating pins 52 and 53 and the height position of the upper end of the pulling pin 55 corresponding thereto are associated with each other is acquired in advance. Then, when the height positions of the elevating pins 52 and 53 are set by the control part 100, for example, the elevating part 552 may be controlled so that the height position of the pulling pin 55 becomes an appropriate position.

Here, when the lower surface of the wrist part 32 is inclined from the horizontal due to the adjustment of the inclination of the fork 31, the positional relationship between the pulling pin 55 and the wrist part 32 changes. Therefore, even when the wrist part 32 is inclined with respect to the housing 6, the wrist part 32 is pulled downward by forming a contact region between the head part 551 and the wrist part 32 in a hemispherical shape and allowing the head part 551 to move with respect to the opening part 323.

In this way, the inclination adjusting mechanism 5 can adjust the inclination of the fork 31 around the two axes including the pitch axis 34 and the roll axis 33. Further, since one of the three support pins 51 to 53 is the fixing pin 51 of which a height of the upper end is fixed, the fixing pin 51 serves as a reference for the height position, and the inclination of the fork 31 can be easily adjusted.

Other Examples

Figure 7A:
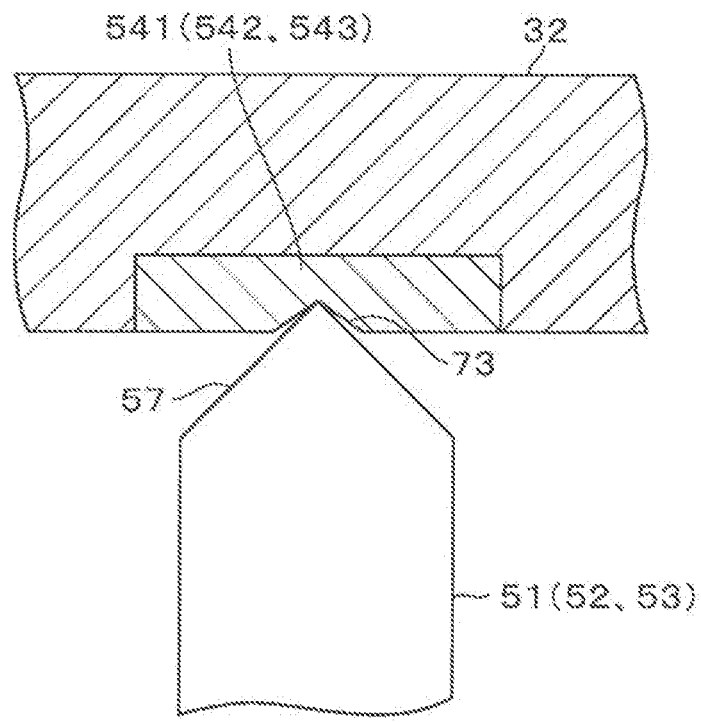
FIG. 7A is a longitudinally sectional side view illustrating a part of the inclination adjusting mechanism.
Figure 7B:
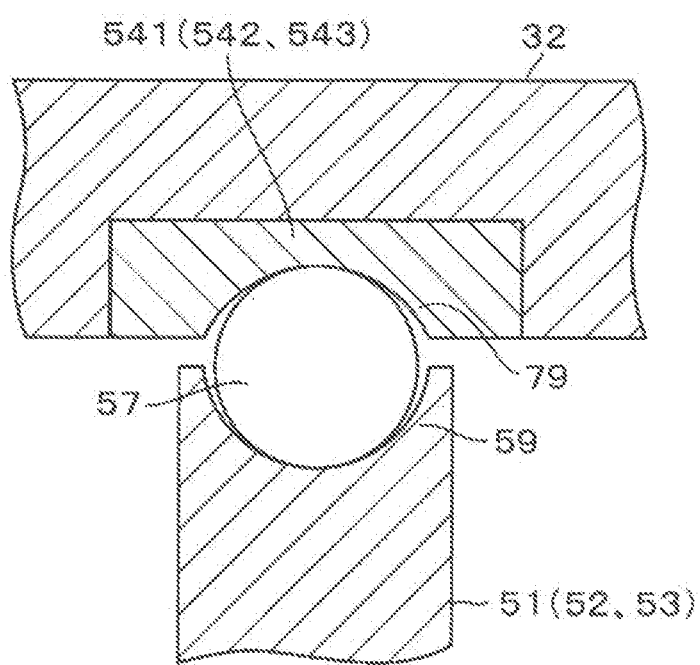
FIG. 7B is a longitudinally sectional side view illustrating a part of the inclination adjusting mechanism.

In the substrate transport apparatus 2, as illustrated in FIGS. 7A and 7B, a recess for positioning the support pin may be formed in the lower surface of the wrist part 32, and the upper end of the support pin may be configured to be fitted into the recess. FIGS. 7A and 7B show an example of the recess formed in the lower surface of the wrist part 32. The recesses are formed in a lower surface of each of the constituent members 541 to 543 provided in a region of the wrist part 32 in contact with the upper ends of the support pins 51 to 53.

FIG. 7A shows an example in which a recess 73 is formed in a conical shape, and the upper ends 57 of the support pins 51 to 53 are formed in a conical shape to be fitted into the recess 73. When the inclination of the fork 31 is adjusted by the inclination adjusting mechanism 5, since the positional relationship between the support pins 51 to 53 and the wrist part 32 changes as described above, shapes of both are set to correspond thereto. In this example, since the support pins 51 to 53 are positioned when the support pins 51 to 53 come into contact with the wrist part 32, position accuracy is improved, and the adjustment of the inclination of the fork 31 due to the inclination adjusting mechanism 5 can be reliably performed.

Further, FIG. 7B shows an example in which a substantially hemispherical recess 79 is formed and a ball 58 is provided between the support pins 51 to 53 and the recess 79. A region 59 of each of the support pins 51 to 53 in contact with the ball 58 is formed in a spherical shape so as to correspond to the ball 58. In this case, since the support pins 51 to 53 come into contact with the wrist part 32 via the ball 58, the upper ends of the support pins 51 to 53 correspond to the ball 58, and the recess 79 is configured so that the ball 58 is fitted thereinto. Also in this example, the position accuracy when the support pins 51 to 53 come into contact with the wrist part 32 is improved. Further, since the support pins 51 to 53 come into contact with the wrist part 32 via the rotatable ball 58, wear of both can be suppressed as compared with a case in which the recess 79 and the support pins 51 to 53 come into direct contact with each other.

According to the substrate transport apparatus 2, in the inclination adjusting mechanism 5, the fork 31 is pulled toward the support pins 51 to 53 by the pulling pin 55, and the height positions of the upper ends of the support pins 51 to 53 are changed relative to each other. Therefore, the inclination of the fork 31 can be adjusted while the state in which the upper ends of the support pins 51 to 53 and the lower surface of the wrist part 32 are in contact with each other is maintained. As a result, the inclination of the fork 31 can be adjusted accurately, and the posture of the fork 31 after the inclination is adjusted can be maintained in a stable state.

In recent years, as a diameter of a semiconductor wafer which is a substrate has increased, the fork 31 tends to become longer and the inclination (a deflection) of the fork 31 tends to increase. Further, in order to reduce an occupied area of the processing system 1, it is necessary to access wafers stacked in multiple stages at narrow intervals in the vertical direction, and there is an increasing demand for leveling the fork 31 with higher accuracy than in the past. As described above, since the substrate transport apparatus 2 of the present disclosure can accurately perform the adjustment of the inclination of the fork 31, it can be used even when the fork 31 has a large inclination, and the fork 31 can be adjusted horizontally with high accuracy.

Second Embodiment of Substrate Transport Apparatus

Figure 8:
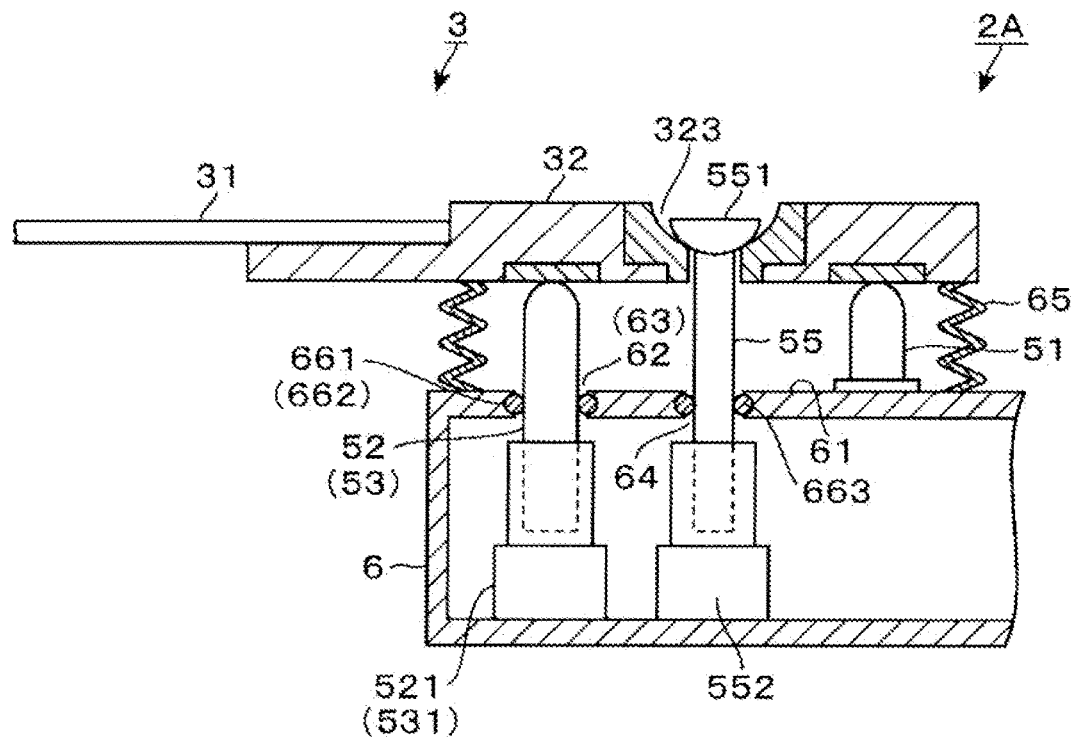
FIG. 8 is a longitudinally sectional side view illustrating a substrate transport apparatus according to a second embodiment.

Subsequently, with reference to FIG. 8, a second embodiment of the substrate transport apparatus will be described by taking an example case in which the second embodiment is applied to the vacuum transport mechanism 22. A substrate transport apparatus 2A of this example is configured so that, in the top plate 61 constituting the housing 6, through holes 62, 63, and 64, which are through positions through which the support pins 52 and 53 and the pulling pin 55 pass, are provided with sealing members 66 (661, 662, and 663), each of which is, for example, an O-ring. The sealing member 66 plays a role of separating an internal space of the housing 6 from the external vacuum atmosphere. The support pins 52 and 53 and the pulling pin 55 are inserted into a vacuum atmosphere region surrounded by bellows 65 through the top plate 61 constituting the housing 6. Other configurations are the same as those in the first embodiment described above.

According to such a configuration, due to the sealing member 66 and the bellows 65, the elevating mechanisms 521 and 513 and the elevating part 552 are disposed in the housing 6 separated from the vacuum atmosphere while a region in which the support pins 52 and 53 and the pulling pin 55 move upward or downward are maintained in a vacuum atmosphere. Therefore, compared with a case in which the elevating mechanism 521 and the like are disposed in the vacuum atmosphere when the inclination of the fork 31 is adjusted in the vacuum atmosphere, it is not necessary to individually configure the elevating mechanism 521 and the like for the vacuum atmosphere, and a simple configuration can be achieved.

Third Embodiment of Substrate Transport Apparatus

Figure 9:
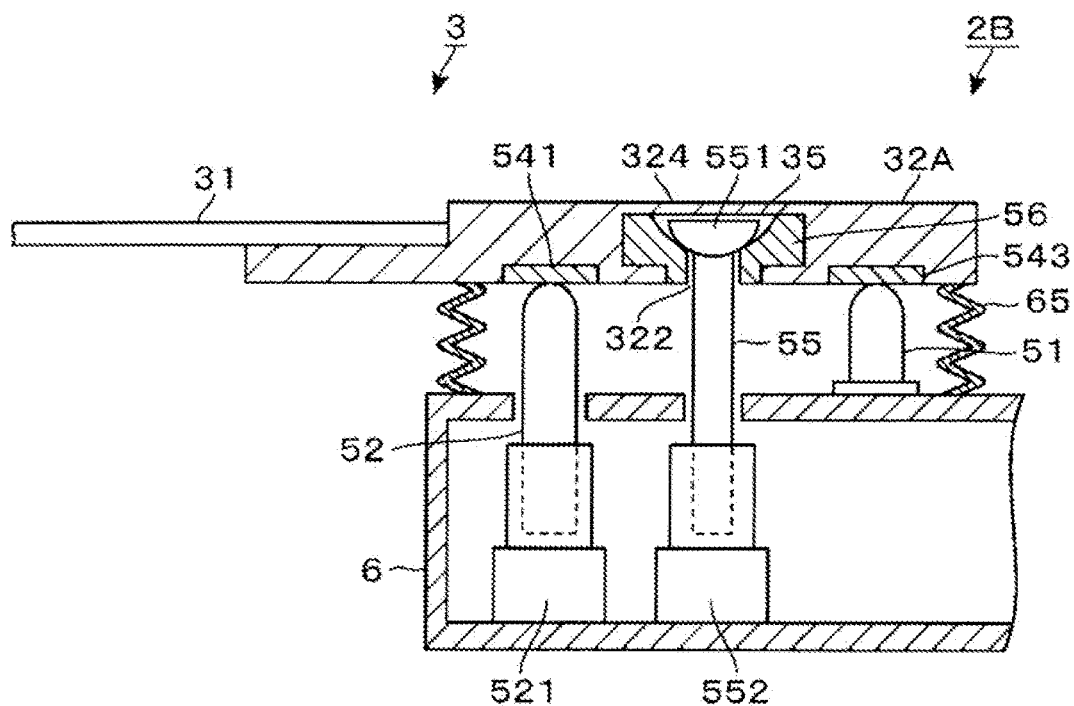
FIG. 9 is a longitudinally sectional side view illustrating a substrate transport apparatus according to a third embodiment.

Subsequently, with reference to FIG. 9, a third embodiment of the substrate transport apparatus will be described by taking an example case in which the third embodiment is applied to the vacuum transport mechanism 22. A substrate transport apparatus 2B of this example includes a lid member which closes the through hole 322 of the wrist part 32. The through hole 322 is for the pulling pin 55 to pass through a wrist part 32A, and the lid member is installed at a position above the head part 551 to close the through hole 322. In this example, a member constituting the upper surface of the wrist part 32A is installed as a lid member 324, and the lower side of the lid member 324 is a recess 35 formed in the lower surface of the wrist part 32A. The recess 35 forms the through hole 322 and also forms an opening part having a shape corresponding to the lower surface of the head part 551 of the pulling pin 55. In this way, the upper side of the head part 551 can be closed by the lid member 324 configured as the upper surface of the wrist part 32A. With such a configuration, the region surrounded by the bellows 65 and the internal space of the housing 6 can be separated from the external vacuum atmosphere. Other configurations are the same as those in the first embodiment described above.

Also in this example, the elevating mechanisms 521 and 531 of the support pins 52 and 53 and the elevating part 552 of the pulling pin 55 are disposed in the housing 6 separated from the vacuum atmosphere. Therefore, as compared with a case in which the elevating mechanism 521 and the like are disposed in the vacuum atmosphere when the inclination of the fork 31 is adjusted in the vacuum atmosphere, the configuration can be simplified. Further, when the bellows 65 is provided by welding each of the lower surface of the wrist part 32 and the top plate 61 of the housing 6, an atmosphere having a higher degree of vacuum can be maintained.

Fourth Embodiment of Substrate Transport Apparatus

Figure 10:
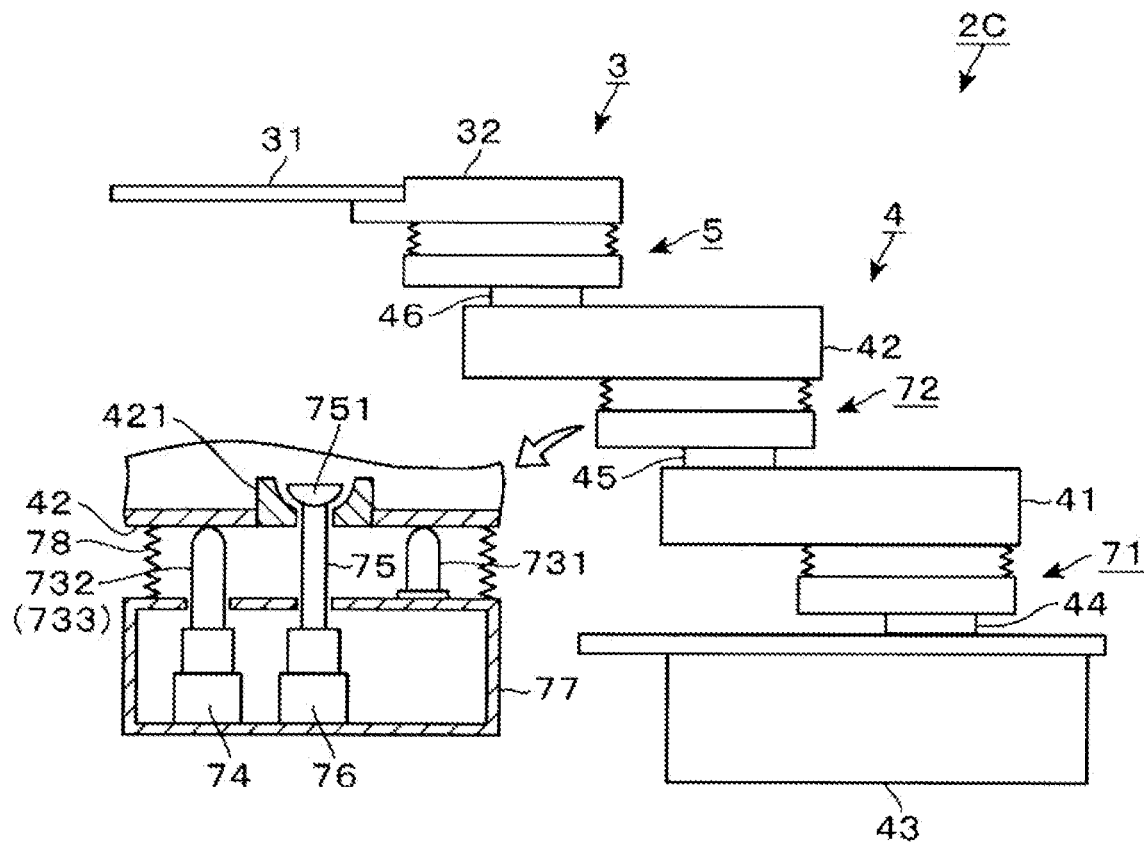
FIG. 10 is a side view illustrating a substrate transport apparatus according to a fourth embodiment.

A fourth embodiment of the substrate transport apparatus will be described with reference to FIG. 10 by taking an example case in which the fourth embodiment is applied to the atmospheric transport mechanism 21. A substrate transport apparatus 2C of this example includes an inclination adjusting mechanism 7 on the arm part side for adjusting the inclination of the fork 31. The inclination adjusting mechanism 7 on the arm part side adjusts the inclination of the fork 31 on the tip end side by being connected to one arm part and adjusting the inclination of the other arm part which is disposed closer to the fork 31 than the one arm part.

Specifically, the substrate transport apparatus 2C includes a first arm inclination adjusting mechanism 71 which adjusts the inclination of the first arm part 41, and a second arm inclination adjusting mechanism 72 which adjusts the inclination of the second arm part 42. Further, in this embodiment, it is assumed that the base 43 constituting a part of the arm 4 also constitutes an arm part to which the first arm part 41 is rotatably connected via the first joint part 44.

At this time, the first arm inclination adjusting mechanism 71 is connected to the base 43 forming one arm part via the first joint part 44, and the inclination of the fork 31 is adjusted by adjusting the inclination of the first arm part 41 which is the other arm part. The second arm inclination adjusting mechanism 72 is connected to the first arm part 41 forming one arm part via the second joint part 45, and the inclination of the fork 31 is adjusted by adjusting the inclination of the second arm part 42 which is the other arm part.

The first arm inclination adjusting mechanism 71 and the second arm inclination adjusting mechanism 72 are configured in the same manner as the inclination adjusting mechanism 5. As illustrated in FIG. 10 with an example of the second arm inclination adjusting mechanism 72, the second arm part 42 which is the other arm part is provided to support the lower surface of the second arm part 42, and three arm support pins 731 to 733, each of which is disposed at a position at which an apex of a triangle is formed in a plan view, are included. The three arm part support pins 731 to 733 are configured so that the height positions of upper ends thereof can be changed relative to each other by the elevating mechanism 74 forming an arm part height adjusting part. In this example, one of the three arm part support pins 731 to 733 is installed as an arm part fixing pin 731 of which a height position of an upper end does not change. Further, an arm part pulling pin 75 is disposed inside the triangle. In order to maintain a state in which the upper ends of the three arm part support pins 731 to 733 and the lower surface of the second arm part 42 are in contact with each other, the arm part pulling pin 75 is provided to pull the second arm part 42 toward the arm part support pins 731 to 733.

A shape of the head part 751 at the upper end of the arm part pulling pin 75 and a shape of the constituent member 421 installed on the second arm part 42 side and in contact with the lower surface of the head part 751 of the arm part pulling pin 75 are the same as that of the pulling pin 55 of the first embodiment. Further, in FIG. 10, a reference numeral 76 indicates an elevating part which changes the height position of the upper end of the arm part pulling pin 75, a reference numeral 77 indicates a housing, a reference numeral 78 indicates a bellows, which are configured in the same manner as the elevating part 552, the housing 6, and the bellows 65 of the first embodiment.

According to such a configuration, the adjustment of the inclination of the fork 31 can be performed by the inclination adjusting mechanism 5 and the inclination adjusting mechanism 7 of the arm part. Therefore, an amount of adjustment can be reduced to easily perform the adjustment by adusting the inclination of the entire arm 4 with the inclination adjusting mechanism 7 of the arm part and adjusting the inclination of the fork 31 with the inclination adjusting mechanism 5. Further, even when the fork 31 has a large inclination, it is possible to divide the roles such as performing rough adjustment on the arm part side and performing fine adjustment on the fork 31 side by bearing a part of the amount of adjustment on the arm 4 side. The inclination adjusting mechanism 7 of the arm part may have a configuration in which at least one of the first arm inclination adjusting mechanism 71 and the second arm inclination adjusting mechanism 72 is provided.

Fifth Embodiment of Substrate Transport Apparatus

Figure 11:
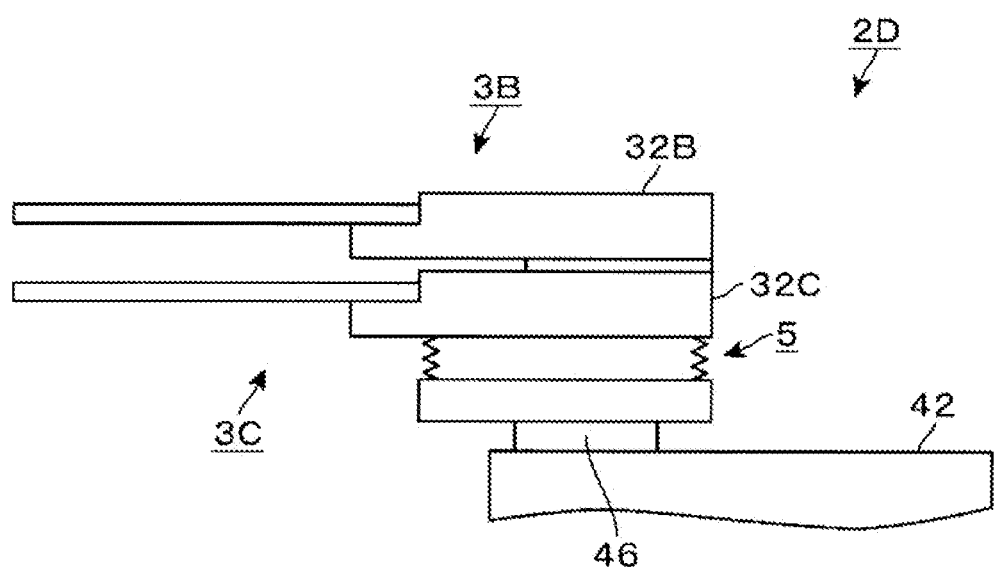
FIG. 11 is a side view illustrating a substrate transport apparatus according to a fifth embodiment.

A fifth embodiment of the substrate transport apparatus will be described with reference to FIG. 11 with respect to differences from the above-described embodiment. In this example, in a substrate transport mechanism 2D in which a plurality of end effectors, for example, two, are provided, the inclination adjusting mechanism 5 is provided between a wrist part 32C of an effector 3C on the lower end side and the arm 4 (the second arm part 42 in this example). Each of the effectors 3B and 3C on the upper and lower end sides is configured in the same manner as the end effector 3 of the first embodiment, and a wrist part 32B of the effector 3B on the upper end side is provided on the wrist part 32C of the effector 3C on the lower end side. The inclination adjusting mechanism 5 and other constituent members are configured in the same manner as in the above-described first embodiment.

In this configuration, the inclination of the fork 31 on the lower side can be adjusted from the inclination adjusting mechanism 5 via the wrist part 32C on the lower side. Further, the inclination of the wrist part 32B is adjusted by the inclination adjusting mechanism 5 via the wrist part 32C on the lower side, and thus the inclination of the fork 31 on the upper side can be adjusted at the same time.

Sixth Embodiment of Substrate Transport Apparatus

Figure 12:
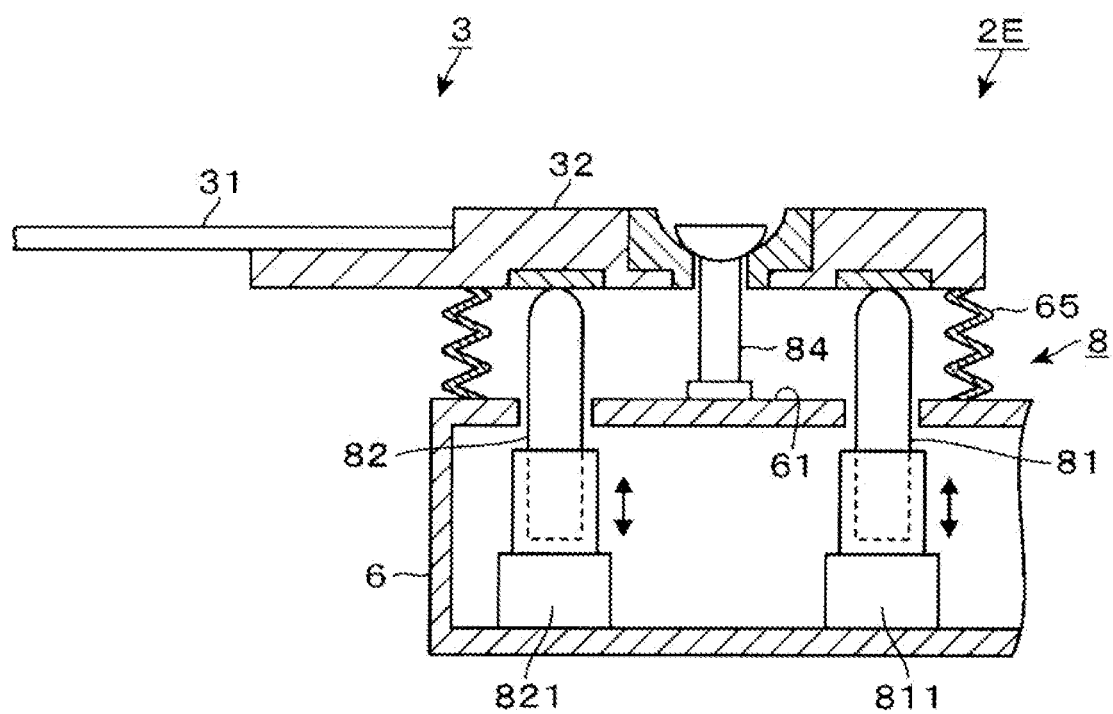
FIG. 12 is a longitudinally sectional side view illustrating a substrate transport apparatus according to a sixth embodiment.
Figure 13:
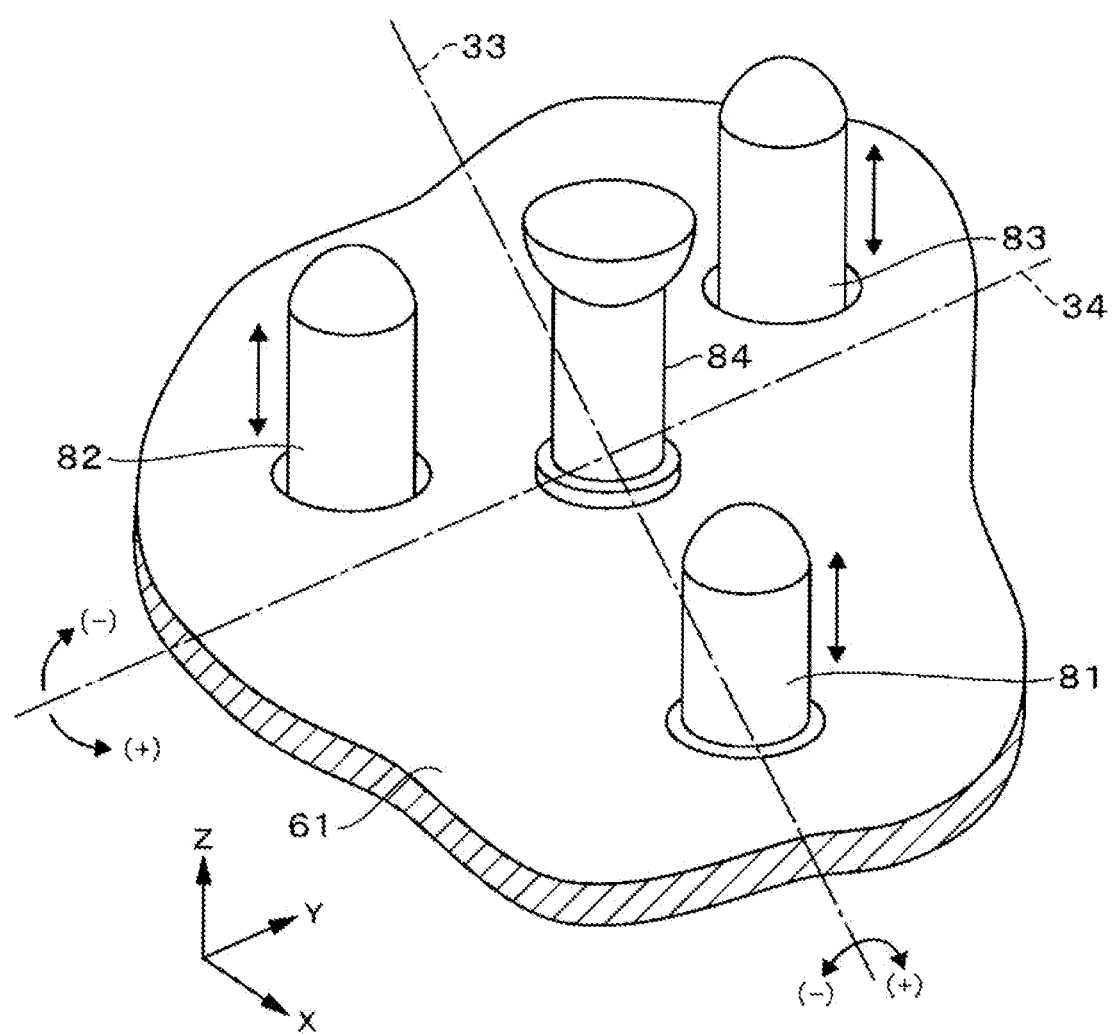
FIG. 13 is a perspective view illustrating a part of the inclination adjusting mechanism according to the sixth embodiment.

A sixth embodiment of the substrate transport apparatus will be described with reference to FIGS. 12 and 13 with respect to the differences from the above-described embodiment. In a substrate transport apparatus 2E of this example, the inclination adjusting mechanism 8 is configured so that the three support pins 81, 82, and 83 can move upward or downward independently of each other by elevating mechanisms 811, 821, and 831 forming the height adjusting part. Further, a pulling pin 84 is configured as a fixing pin of which a height position of an upper end is fixed and is installed to be fixed to the upper surface of the top plate 61 of the housing 6, for example. This embodiment is configured in the same manner as in the first embodiment except that the support pins 81 to 83 are movable upward or downward, and the height of the upper end of the pulling pin 84 is fixed.

In this configuration, the wrist part 32 rotates around the pitch axis 34, and the inclination of the fork 31 in the front-rear direction can be adjusted by aligning the height positions of the upper ends of the support pins 82 and 83 and changing these height positions relative to the height positions of the upper ends of the support pins 81. Further, the wrist part 32 rotates around the roll axis 33, and the inclination of the fork 31 in the left - right direction can be adjusted, for example, by setting the height position of the upper end of the support pin 81 to a position when the wrist part 32 is horizontal and changing the height position of the upper ends of the support pins 82 and 83 relatively.

<Control Part of Substrate Transport Apparatus>

Next, a case in which teaching is performed using the substrate transport apparatus 2 will be described. As described above, since the inclination of the fork 31 increases as the diameter of the wafer increases, and in the substrate transport apparatus 2 using an articulated arm, the inclination of the fork 31 changes according to the posture, it is required to adjust the inclination according to the posture of the fork 31 during transportation. Further, when the wafer is delivered, the fork 31 needs to be horizontal, and in order to transport the wafer at high speed and to improve throughput, teaching to make the fork 31 horizontal is required.

In performing such teaching, the control part 100 is configured to be able to acquire inclinantion data indicating a direction and magnitude of the inclination from a basic posture from a sensor substrate 8 described below. Then, the control part 100 is configured to control the inclination adjusting mechanism 5 to offset the inclination of the fork 31, when the wafer is transported, based on a result of transporting the sensor substrate 8 from a wafer transport source to a transport destination and acquiring the inclination data. Further, due to use of the sensor substrate 8, it is possible to identify deviation between a position of the sensor substrate 8 grasped by the control part 100 and an actual position of the sensor substrate 8 and to perform control to offset the deviation. Delivery of data between the sensor substrate 8 and the control part 100 is performed using, for example, wireless communication.

Figure 14:
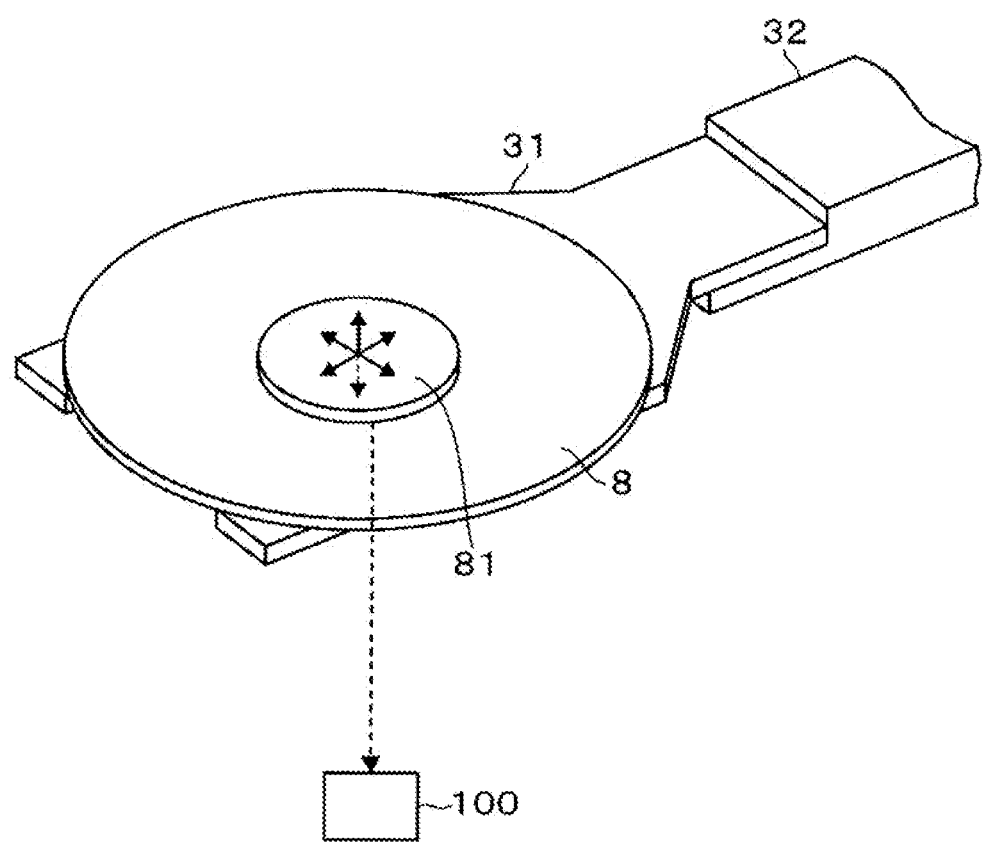
FIG. 14 is a perspective view illustrating a fork which holds a sensor substrate.

The sensor substrate 8 is a substrate including an acceleration sensor 81 which is configured to be transportable in a state of being held by the fork 31 and detects the direction and magnitude of inclination from the basic posture. As illustrated in FIG. 14, the sensor substrate 8 is formed in a shape similar to, for example, a wafer, and the acceleration sensor 81 is provided thereon. As the acceleration sensor 81, for example, a configuration described in Japanese Patent Application Laid-Open No. 2004-264053 is adopted, for example, a movable structure part which is movable in a three-dimensional direction is included, and a change in stress corresponding to movement of the movable structure part is detected as a change in resistance.

Then, the acceleration sensor 81 detects components of an acceleration acting on the acceleration sensor 81 in X, Y, and Z axis directions and outputs the components to the control part 100. From the acceleration detected by the acceleration sensor 81, it is possible to detect each vector component of a gravitational acceleration generated by the inclination from the basic posture and to obtain the inclination data indicating the direction and magnitude of the inclination from the basic attitude. The basic posture is a posture of the fork 31 which is horizontal in the front-rear direction and the left-right direction, and when the acceleration sensor 81 is mounted on the fork 31 in this posture, the posture of the acceleration sensor 81 becomes the basic posture. Therefore, the inclination data acquired by the sensor substrate 8 indicates the direction and magnitude of the inclination of the fork 31 from the basic posture.

Further, from the acceleration detected by the acceleration sensor 81, it is possible to obtain acceleration data indicating the direction and magnitude in which an inertial force is applied as the sensor substrate 8 moves. Position data of the sensor substrate 8 can be obtained from the above acceleration data. The position data is, for example, positions of the sensor substrate 8 transported by the fork 31 in the X, Y, and Z axis directions. The position data can be grasped by obtaining a moving speed based on the acceleration data acting in each axial direction and integrating the moving speed over time.

For example, in the inclination data, regarding the inclination and magnitude in the front-rear direction around the pitch axis 34, the inclination is set as "0" in the basic posture (the horizontal), the inclination in which the forward direction is lowered is set as a positive inclination, and the inclination in which the forward direction is raised is set as a negative inclination. Further, regarding the inclination and magnitude in the left-right direction around the roll axis 33, the inclination is set as "0" in the basic posture, the inclination in which the left direction is lowered is set as a negative inclination, and the inclination in which the left direction is raised is set as a positive inclination. The direction of each of the inclinations is also illustrated in FIGS. 3A, 5 and 13.

First Example of Teaching

Subsequently, a first example of teaching performed in a state in which the sensor substrate 8 is mounted on the substrate transport apparatus 2 of the present disclosure will be described. This teaching is for moving the fork 31 along a preset transport path while the basic posture (the horizontal) is maintained when the wafer is transported from the transport source to the transport destination. The teaching is performed, for example, at the time of starting up the apparatus or after maintenance is completed. In this teaching, the sensor substrate 8 including, for example, the acceleration sensor 81 has the same load as the wafer.

In the following example, a case in which a step of holding the sensor substrate 8 with the fork 31, transporting the sensor substrate 8 with the atmospheric transport mechanism 21 which is the substrate transport apparatus 2, and acquiring the inclination data is performed will be described. As the transport path, a case in which the wafer is transported from the container 10 of the load port 16 which is the transport source of the wafer to the load lock chamber 12 which is the transport destination will be described. In addition, a step of setting the transport source of the wafer to the load lock chamber 12, transporting the sensor substrate 8 with the vacuum transport mechanism 22 which is the substrate transport apparatus 2 to the transport destination, for example, one of the vacuum processing chambers 14, and acquiring the inclination data may be performed. In this step, for example, the atmospheric transport mechanism 21 takes the sensor substrate 8 out of the container 10 and transports the sensor substrate 8 from the transport source to the transport destination at a preset height position in a state in which the sensor substrate 8 is mounted on the fork 31. At this time, the sensor substrate 8 constantly detects the acceleration acting on the sensor substrate 8 and outputs the acceleration to the control part 100.

Then, the control part 100 obtains the above-described inclination data, acceleration data, and position data based on the acceleration obtained from the sensor substrate 8 and acting in each direction. After that, a step of controlling the inclination adjusting mechanism 5 is performed to offset the inclination of the fork 31 when the wafer is transported. The deviation between the position on the transport path (hereinafter, it may be referred to as a "transport position") grasped by the control part 100 and the actual position data is offset by controlling the rotation mechanism 47 of the fork 31 and the arm 4 and the elevating mechanism and the moving mechanism of the base 43.

An example of control of the inclination adjusting mechanism 5 will be described. For example, the control part 100 acquires the inclination data acquired from the sensor substrate 8 in association with position information of the sensor substrate 8 held by the atmospheric transport mechanism 21. As described above, the position of the sensor substrate 8 can be identified by the position information for performing the transport control of the atmospheric transport mechanism 21 by the control part 100 and the position data acquired using the acceleration sensor 81.

Further, here, when the arm 4 and the fork 31 are inclined, the sensor substrate 8 may not reach a preset height position even though the base 43 is raised to the preset height position. In this case, deviation occurs between the position information related to the transport control of the atmospheric transport mechanism 21 and the position data grasped by the acceleration sensor 81. Therefore, in this teaching, this deviation is grasped and used for correction of the position information related to the transport control.

The position information on the control part 100 side is grasped based on an expansion and contraction amount and a rotation amount of the arm 4 and the fork 31, and an elevating amount and a movement amount of the base 43.

The inclination data and the position data obtained by the sensor substrate 8 are associated with the transport position identified by the control part 100. From the inclination data, it is possible to grasp the direction and magnitude of the inclination of the fork 31 from the basic posture at each position on the transport path. Further, the actual position of the sensor substrate 8 held by the fork 31 is obtained based on the position data of the sensor substrate 8. Then, at each transport position, the direction and magnitude of the inclination of the fork 31 at that position and the direction and amount of deviation between the actual position of the sensor substrate 8 and the transport position grasped by the control part 100 are identified. After that, the inclination and the amount of deviation of the transport position are offset, and correction data in which the fork 31 has the basic posture at a correct transport position is created.

As described above, the control part 100 has acquired the inclination data capable of identifying the direction and magnitude of the inclination with respect to the inclination in the front-rear direction. Therefore, correction data for performing control so that an amount of correction of the inclination is equal to the magnitude of the inclination and a correction direction is controlled to be opposite to the inclination data is created. Similarly, the control part 100 acquires the inclination data capable of identifying the direction and magnitude of the inclination even with respect to the inclination in the left-right direction. Then, the correction data in which the amount of correction of the inclination is equal to the magnitude of the inclination and the correction direction is controlled to be opposite to the inclination data is created. In this way, the correction data of the inclination adjusting mechanism 5 at each transport position is created.

Further, with respect to the deviation between the transport position grasped by the control part 100 and the position data of the sensor substrate 8, correction data which offsets the deviation is created.

As an example, a case in which bending (loosely hanging) of each of the arms 4 toward the fork 31 side occurs due to a load of the sensor substrate 8 when the arm 4 is extended will be described. In this case, it is not always possible to correct deviation of a holding height of the wafer due to the bending of the arm 4 only by adjusting the pitch direction with the inclination adjusting mechanism 5. Therefore, the correction data is created so that the fork 31 is adjusted to be horizontal by the inclination adjusting mechanism 5 and a height of the fork 31 in the Z-axis direction is corrected by the elevating mechanism of the base 43, as described above.

Subsequently, in order to confirm a result of the above-described correction, while the sensor substrate 8 is held by the fork 31 of the atmospheric transport mechanism 21, and the inclination adjusting mechanism 5 and the like are controlled based on the created correction data, the sensor substrate 8 is transported from the transport source (the container 10) to the transport destination (the load lock chamber 12). Then, at each transport position, it is confirmed that the inclination in each of the roll direction and the pitch direction is within an allowable inclination range and the fork 31 is substantially in the basic posture (the horizontal), and then the teaching is completed.

In this example, the control of the inclination adjusting mechanism 5 is performed based on the inclination data of the fork 31 acquired by transporting the sensor substrate 8 from the transport source of the wafer to the transport destination. Therefore, the inclination of the fork 31 can be grasped even in the posture in which the substrate transport apparatus 2 is transporting the wafer. Then, since the control of the inclination adjusting mechanism 5 is performed to offset the inclination of the fork 31 when the wafer is transported, the teaching for all postures when the wafer is transported can be performed by a simple method.

In this teaching, the inclination of the fork 31 around the pitch axis 34 and the inclination thereof around the roll axis 33 may also be adjusted by the inclination adjusting mechanism 5.

Further, in this teaching, position deviation from the position information on the transport path obtained from the control part 100 is grasped based on the position data of the sensor substrate 8. Then, the elevating mechanism of the arm 4 and the base 43 of the substrate transport apparatus 2 is controlled to offset the position deviation. Thus, even when the arm 4 is bent by a load of the wafer having the same load as the sensor substrate 8, the wafer can be transported along the preset transport path. Therefore, it is possible to prevent occurrence of problems such as the wafer coming into contact with other parts due to the occurrence of bending and thus transport along a path deviating from the correct transport path.

Further, since the teaching can be performed by transporting the sensor substrate 8, time required for the teaching can be shortened. Further, when a worker performs the teaching, the teaching may not be performed in a narrow space in the processing system 1 in which the worker cannot enter. On the other hand, according to the method of this example, since the teaching can be performed by the substrate transport mechanism 2D holding and transporting the sensor substrate 8, the teaching can be performed for all paths for transporting the wafer.

Second Example of Teaching

Further, the control part 100 may be configured to correct an amount of offset of the inclination of the fork 31 according to a load of the wafer or other objects to be transported based on the inclination data acquired using the sensor substrate 8 as described above. In the following description, for example, it is assumed that the sensor substrate 8 with the acceleration sensor 81 is configured as a substrate which is heavier than the wafer.

In this case, teaching is performed at least twice by changing the load of the object to be transported. For example, in the first teaching, the sensor substrate 8 is mounted on the fork 31 and transported from the transport source to the transport destination, and the acceleration data and the inclination data are acquired from the sensor substrate 8 in the same manner as in the above-described first example. The position data of the sensor substrate 8 can be acquired from the acceleration data. Then, the acceleration data, the inclination data, and the position data are associated with the position information of the sensor substrate 8. Here, the point that the position information of the sensor substrate 8 is obtained from the control part 100, and as described above, the position information, can be grasped based on the expansion and contraction amount and rotation amount of the arm 4 and the fork 31, and the elevating amount and movement amount of the base 43 is the same as in the first example. Next, the second teaching is performed by the same method as the first teaching except that the sensor substrate 8 on which a weight is mounted is held by the fork 31. As a result, the acceleration data, the inclination data, and the position data can be associated with the position information of the sensor substrate 8 under a condition in which the load of the object to be transported is different from that in the first time.

Figure 15:
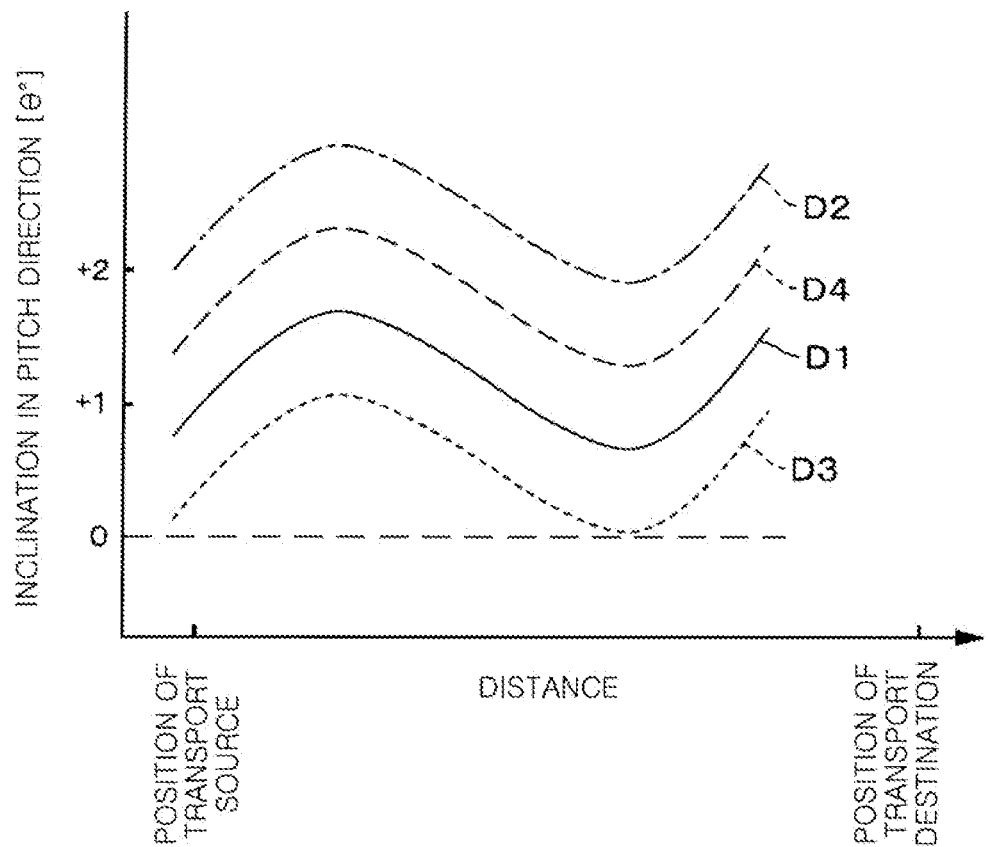
FIG. 15 is a characteristic diagram illustrating an example of acquisition and an example of prediction of inclination data.

FIG. 15 shows the inclination data with respect to the inclination in the pitch direction acquired in the above-described two teachings. In FIG. 15, a horizontal axis represents a distance (a transport position) from a position of the transport destination (a start position) along the transport path, and a vertical axis represents the inclination in the pitch direction. In FIG. 15, a solid line is inclination data D1 acquired using the sensor substrate 8, and an alternate long and short dash line is inclination data D2 acquired using the sensor substrate 8 on which a weight is mounted.

The inclination in the pitch direction is a direction in which the tip end of the fork 31 hangs loosely in a plus (+) direction, and as a value becomes larger, the loosely hanging increases. For example, the loosely hanging of the fork 31 tends to increase when the arm 4 is extended and decreases when the arm 4 is retracted. Further, from FIG. 5, it can be seen that when the load of the object to be transported is large, the loosely hanging tends to be large, and when the load is small, the loosely hanging tends to be small.

FIG. 15 is data for convenience of explanation and does not show a change of state of the loosely hanging which occurs in the actual fork 31.

As described above, although there is a correlation between the load of the object to be transported mounted on the fork 31 and the inclination data, and the inclination direction of the fork 31 is the same at each transport position, as described above, as the load of the object to be transported becomes heavier, the inclination tends to increase. Therefore, the relationship between the load and the inclination data can be grasped by acquiring the inclination data when the sensor substrate 8 is transported and when the sensor substrate 8 on which the weight is mounted is transported. Thus, it is possible to acquire an estimated value of the inclination data of the fork 31 according to the load of the object to be transported which has a weight different from that of the sensor substrate 8.

In FIG. 15, a dotted line D3 is an estimated value of the inclination data of the wafer lighter than the sensor substrate 8, and a dashed line D4 is an estimated value of the inclination data of the object to be transported which is heavier than the sensor substrate 8. An example of the object to be transported, which is heavier than the sensor substrate 8, is a case in which a replacement member such as a focus ring installed on a mounting table of the vacuum processing chamber 14 is transported by the substrate transport apparatus 2.

Then, the control part 100 is configured to correct the amount of offset of the inclination of the fork 31 due to the inclination adjusting mechanism 5 based on the inclination data acquired according to the load of the object to be transported. The correction of the amount of offset of the inclination of the fork 31 can be performed, for example, by obtaining the amount of offset of the inclination of the fork due to the inclination adjusting mechanism 5 when the object to be transported is transported based on the estimated value of the inclination data.

For example, a case is considered in which an inclination θ in the pitch direction in the two acquired inclination data D1 and D2 changes linearly according to a load w of the object to be transported. For example, the load of the sensor substrate 8 is W1, a load of the weight is W, the inclination of the inclination data D1 at a certain transport position is θ (D1), and the inclination of the inclination data D2 is θ (D2). In this case, the inclination θ of the fork 31 at a desired transport position when the object to be transported is transported can be expressed by the following Equation (1).

$$\theta = \theta(D1) + \{(\theta(D2) - \theta(D1))/W\}*(w - W1) \quad (1)$$

The control part 100 creates correction data for the posture of the fork 31 to offset the inclination θ estimated by the above-described method. Here, the example in which the inclination in the pitch direction is adjusted has been described, but regarding the inclination in the roll direction, the inclination of the fork 31 can also be corrected by the inclination adjusting mechanism 5 according to the load of the object to be transported.

Next, a method of correcting the position deviation from the position information on the transport path obtained from the control part 100 based on the position data obtained by the above-described two teachings will be described. For example, when an output of a motor of the rotation mechanism 47 for driving the arm 4, the elevating mechanism of the base 43, and the moving mechanism is constant, as the load of the object to be transported is heavier, the acceleration acting on the object to be transported decreases. Therefore, it is possible to grasp correspondence relationship between the load of the object to be transported and the acceleration acting on the object to be transported from the two teachings. Thus, even when the actual load of the object to be transported is different from a load at the time of the two teachings, the acceleration data acting on the object to be transported can be estimated at each transport position. For example, the estimated value of the acceleration data can be obtained by interpolation and extrapolation from a change of the correspondence relationship at the time of the teaching.

Once the estimated value of the acceleration data is obtained, the position data can be estimated by obtaining a moving speed of the object to be transported and integrating the moving speed over time. Then, the point that the direction and amount of deviation between the transport position grasped by the control part 100 and the position data of the object to be transported is identified and the correction data is created to offset the deviation is the same as the teaching according to the first example.

According to the second example, even when the inclination data is not acquired using the sensor substrate 8 having the same load as the object to be transported, the amount of offset of the inclination of the fork 31 due to the inclination adjusting mechanism 5 can be grasped, and the teaching can be easily performed.

Example of Wafer Transport Method

This example is performed to suppress the movement of the wafer from a preset holding position due to the inertial force acting on the wafer when the wafer held by the fork 31 is moved in a transverse direction. The transverse direction means a horizontal direction and includes both the front-rear direction and the left-right direction. In this example, the control part 100 is configured to control the fork 31 to be inclined by the inclination adjusting mechanism 5 so that the height position of the wafer on the front end side is lower than the height position thereof on the rear end side when seen in a transport direction of the wafer.

Figure 16A:
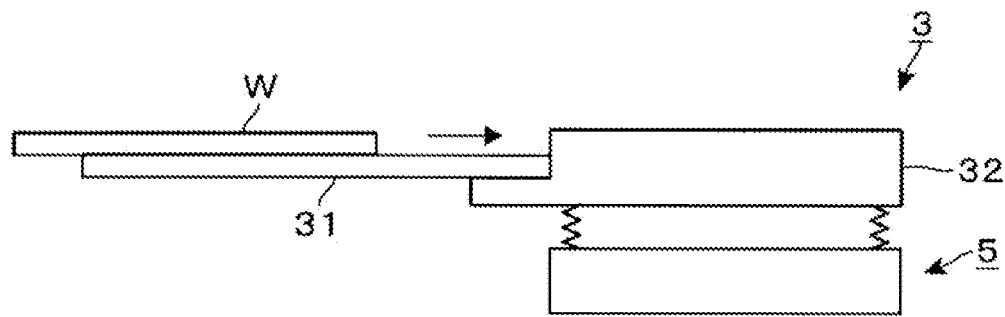
FIG. 16A is a first side view illustrating a wafer transport posture using the substrate transport apparatus.
Figure 16B:
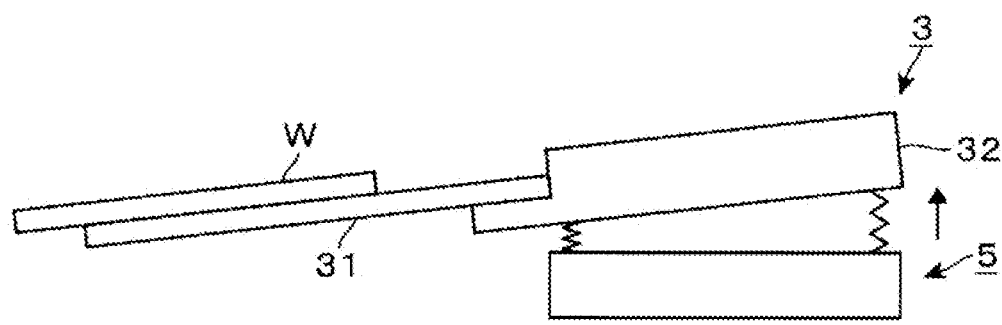
FIG. 16B is a second side view illustrating a wafer transport posture using the substrate transport apparatus.

As illustrated in FIG. 16A, when the wafer is held by the fork 31 and the arm 4 is advanced forward, acceleration may be applied to the wafer, an inertial force may act, and thus the wafer may move rearward from a holding position. In such a case, as illustrated in FIG. 16B, the fork 31 is controlled to be inclined by the inclination adjusting mechanism 5 so that the height position of the wafer on the front end side is lower than the height position thereof on the rear end side. When the fork 31 is inclined in this way, the inertial force which tries to move rearward becomes a force which pushes the wafer against the fork 31, and the movement from the holding position can be suppressed even when acceleration is applied to the wafer. In this example, when the fork 31 holding the wafer is moved in a state in which acceleration is applied, an amount of inclination of the fork 31 which suppresses the movement from the holding position to the rear is grasped by a preliminary experiment or the like. Then, data corresponding to the acceleration, the position to which the acceleration is applied, and the amount of inclination may be acquired, and based on this data, the fork 31 may be controlled to be inclined by the inclination adjusting mechanism 5 at a position at which acceleration which may cause the wafer to move is added.

Further, for example, when the wafer is held by the fork 31 and the arm 4 is retracted rearward, the wafer may move forward from the holding position due to the inertial force. Therefore, in order to suppress this, the control part 100 is configured to control the fork 31 to be inclined by the inclination adjusting mechanism 5 so that the height position of the wafer on the front end side is higher than the height position thereof on the rear end side. In this way, by inclining the fork 31 so that a direction in which the wafer moves is higher due to the inertial force, it is possible to make the wafer difficult to move forward and to suppress the movement of the wafer from the holding position.

Further, for example, when the wafer is held by the fork 31 and the arm 4 is turned, the wafer may move from the holding position in a direction opposite to a turning direction due to the inertial force. In order to suppress this, the control part 100 is configured to control the fork 31 to be inclined in the left-right direction by the inclination adjusting mechanism 5 so that the height position on the front end side in the turning direction is lower than the height position on the rear end side when seen in the transport direction (the turning direction) of the wafer.

In recent years, a rear surface of a wafer may be held by ceramics as a measure against particle contamination and organic pollution on the transport and a measure for transporting a high-temperature wafer. However, in this configuration, the wafer is slippery, and it is difficult to transport the wafer at high speed.

On the other hand, in this example, the fork 31 is controlled to be inclined by the inclination adjusting mechanism 5 in order to suppress the movement of the wafer on the fork 31 due to the inertial force. Therefore, even when the transport speed of the wafer is increased and a large inertial force is applied to the wafer, the movement of the wafer due to the inertial force can be suppressed, and the transport accuracy is improved. Thus, the wafer transport at high speed can be realized, which is advantageous in improving throughput.

In each of the above-described embodiments, the inclination adjusting mechanism may be installed between the fork and the wrist part in the substrate transport apparatus. In this case, the support pin is installed to support the fork from the lower surface side. Further, when the pulling pin includes a head part which spreads like a flange, the pulling pin is to pass through the fork which faces the wrist part and to bring the lower surface of the head part into contact with the upper surface of the fork to pull the head part downward. Further, as illustrated in FIGS. 7A and 7B, when the recess for positioning the support pin is provided, it is installed on the lower surface of the fork, and the bellows is installed to connect the fork to the wrist part.

Further, the support pins may be disposed at positions at which vertices of a triangle are formed when seen in a plan view, and the pulling pin may be disposed inside the triangle. In the above-described example, the case in which the fixed pin is disposed on the roll axis when seen in a plan view and the pulling pin is disposed on a point on which the roll axis and the pitch axis intersect when seen in a plan view is described, but the present disclosure is not limited to such an arrangement. For example, the pulling pin may be disposed on the point on which the roll axis and the pitch axis intersect when seen in a plan view, and the three support pins may be disposed at positions deviated from a direction along the roll axis when seen in a plan view. Further, all of the support pins and the pulling pin may be disposed at positions deviated from the directions along the roll axis and the pitch axis when seen in a plan view. In addition, in a case in which that there are four or more support pins, when there is an arrangement relationship in which there are support pins which are disposed at positions at which vertices of a triangle are formed when seen in a plan view, and the pulling pin is in the triangle, it is within the technical scope of the present disclosure.

Further, in the above-described example, the pulling pin is configured to change the height position of the upper end thereof by the elevating part, but the pulling pin may be configured to be pulled toward the support pin side by a spring. Further, instead of the example in which the lower surface of the head part of the pulling pin is formed in a spherical shape, the lower surface of the head part may be formed in a conical shape, and a curved surface which receives the conical lower surface of the head part may be formed in the wrist part.

In addition, the arm may include one arm part, and the shape of the fork is not limited to the U-shape in a plan view. Further, it is not essential to provide a rotation mechanism between the end effector and the arm part. Furthermore, when the substrate transport apparatus is an atmospheric transport mechanism and the influence of particle contamination is small, it is not essential to provide a bellows which connects the fork to the wrist part or connects the wrist part to the arm. Further, the above-described embodiments may be configured in combination with each other.

<Other Application>

It should be considered that the embodiments disclosed this time are exemplary in all respects and should be considered as being not restrictive. Some of the above embodiments may be omitted, replaced, or modified in various forms without departing from the scope of the appended claims and the gist thereof

What is claimed is:

1. An apparatus for transporting a substrate, comprising:
   an end effector including a fork which holds the substrate and a wrist part which holds a proximal end portion of the fork;
   an arm provided with the end effector installed thereon and a mechanism which moves the fork; and
   an inclination adjusting mechanism provided between the fork and the wrist part or between the wrist part and the arm to adjust an inclination of the fork,
   wherein the inclination adjusting mechanism includes:
   three support pins provided to support the fork or the wrist part from a lower surface side and disposed at positions at which vertices of a triangle are formed when seen in a plan view,
   a height adjusting part which changes height positions of upper ends of the three support pins relative to each other, and a pulling pin disposed inside the triangle to maintain a state in which the upper end of each of the support pins and the lower surface of the fork or the wrist part are in contact with each other, and installed to pull the fork toward a support pin side.

2. The apparatus of claim 1, wherein the three support pins are configured of two elevating pins, which are movable by the height adjusting part upward or downward independently of each other, and one fixing pin, of which a height position of an upper end is fixed, and an elevating part which changes a height position of an upper end of the pulling pin in accordance with an elevating operation of the two elevating pins is installed at the pulling pin.

3. The apparatus of claim 1, wherein
the three support pins are configured to be movable by the height adjusting part upward or downward independently of each other; and
the pulling pin is composed as a fixing pin of which a height position of an upper end is fixed.

4. The apparatus of claim 1, wherein a recess which positions each of the support pins is formed in the lower surface of the fork or the wrist part supported by the support pin, and the upper end of the support pin is configured to be fitted into the recess.

5. The apparatus of claim 1, wherein the inclination adjusting mechanism includes a stretchable bellows installed to connect the fork to the wrist part, or to connect the wrist part to the arm, and the support pin and the pulling pin are installed in a region surrounded by the bellows.

6. The apparatus of claim 2, wherein the pulling pin includes a head part which spreads like a flange at an upper end portion thereof and is configured to pass through the fork facing the wrist part or the wrist part facing the arm and to bring a lower surface of the head part into contact with the upper surface of the fork or the wrist part to perform a pulling operation.

7. The apparatus of claim 6, wherein the apparatus is installed to transport 7. the substrate in a vacuum atmosphere,
the inclination adjusting mechanism includes a stretchable bellows installed to connect the fork to the wrist part or to connect the wrist part to the arm, and
the support pin and the pulling pin are installed in a region surrounded by the bellows.

8. The apparatus of claim 7, wherein the height adjusting part, and the elevating part, when the pulling pin is configured to change the height position of the upper end, are installed in a housing disposed below the support pin and the pulling pin,
the support pin connected to the height adjusting part and the pulling pin connected to the elevating part are inserted into the region surrounded by the bellows through a top plate constituting the housing, and
a sealing member which separates an internal space of the housing from an external vacuum atmosphere is installed at through positions.

9. The apparatus of claim 7, wherein the height adjusting part, and the elevating part, when the pulling pin is configured to change the height position of the upper end, are installed in a housing provided below the support pin and the pulling pin, and
the region surrounded by the bellows and an internal space of the housing are separated from an external vacuum atmosphere by providing a lid member which closes a through hole through which the pulling pin passes the fork or the wrist part at a position above the head part.

10. The apparatus of claim 1, wherein the arm has a configuration in which a plurality of arm parts are rotatably connected to each other via joint parts, and includes an inclination adjusting mechanism on an arm part side which is connected to one arm part and adjusts an inclination of the fork by adjusting an inclination of another arm part disposed at a position closer to the fork than the one arm part, and
the inclination adjusting mechanism on the arm part side includes three arm part support pins installed to support the other arm part from a lower surface side and disposed at positions at which vertices of a triangle are formed when seen in a plan view, an arm part height adjusting part which changes height positions of upper ends of the three arm part support pins relative to each other, and an arm part pulling pin which is disposed inside the triangle to maintain a state in which an upper end of each of the arm part support pins and a lower surface of the other arm part are in contact with each other and is installed to pull the other arm part to the arm support pin side.

11. The apparatus of claim 1, comprising a control part configured to control a movement operation of the fork by the arm and an operation of adjusting the inclination of the fork by the inclination adjusting mechanism, to allow a sensor substrate to be transported in a state of being held by the fork, and to allow inclination data which indicates a direction and magnitude of the inclination to be acquired from the sensor substrate including an acceleration sensor which detects the direction and magnitude of the inclination from a basic posture,
wherein the control part is configured to control the inclination adjusting mechanism to offset the inclination of the fork when the substrate is transported based on a result of transporting the sensor substrate from a transport source to a transport destination of the substrate and acquiring the inclination data.

12. The apparatus of claim 11, wherein the control part is configured to correct an amount of offset of the inclination of the fork according to a load of the substrate or a load of another object to be transported which is different in load from the sensor substrate based on a result of transporting the sensor substrate from the transport source to the transport destination of the substrate and acquiring the inclination data and a result of transporting the sensor substrate on which a weight is mounted from the transport source to the transport destination and acquiring the inclination data.

13. The apparatus of claim 1, comprising a control part which controls a movement operation of the fork by the arm and an operation of adjusting the inclination of the fork by the inclination adjusting mechanism,
wherein the control part is configured to control the fork to be inclined by the inclination adjusting mechanism so that a height position of the substrate on a tip end side is lower than a height position on a rear end side when seen in a transport direction of the substrate in order to move the fork by the arm and to suppress movement of the substrate from a preset holding position due to an inertial force acting on the substrate when the substrate held by the fork is moved in a transverse direction.

14. A system for processing a substrate, comprising:
a processing chamber which accommodates the substrate therein and processes the substrate;

a mounting position at which the substrate before and after being processed in the processing chamber is mounted, and the apparatus for transporting a substrate according to claim 1 which is installed to transport the substrate between the processing chamber and the mounting position.

15. A method of transporting a substrate, comprising:

a step of transporting the substrate using an apparatus for transporting a substrate including an end effector including a fork which holds the substrate and a wrist part which holds a proximal end portion of the fork, an arm provided with the end effector installed thereon and a mechanism which moves the fork, and an inclination adjusting mechanism installed between the fork and the wrist part or between the wrist part and the arm to adjust the inclination of the fork and including three support pins provided to support the fork or the wrist part from a lower surface side and disposed at positions at which vertices of a triangle are formed when seen in a plan view, a height adjusting part that changes height position of upper ends of the three support pins relative to each other, and a pulling pin disposed inside the triangle to maintain a state in which the upper end of each of the support pins and the lower surface of the fork or the wrist part are in contact with each other, and installed to pull the fork toward a support pin side.

16. The method of claim 15, comprising:

a step of holding a sensor substrate including an acceleration sensor which detects a direction and magnitude of inclination from a basic posture on the fork, transporting the sensor substrate from a transport source to a transport destination of the substrate, and acquiring inclination data; and a step of controlling the inclination adjusting mechanism to offset the inclination of the fork when the substrate is transported based on a result of acquiring the inclination data.

17. The method of claim 16, wherein, in the step of acquiring the inclination data, acquisition of the inclination data by transporting the sensor substrate from the transport source to the transport destination of the substrate and acquisition of the inclination data by transporting the sensor substrate on which a weight is mounted from the transport source to the transport destination are performed, and in the step of controlling the inclination adjusting mechanism, correction of an amount of offset of the inclination of the fork according to a load of the substrate or a load of another object to be transported which is different from a load of the sensor substrate is performed based on a result of acquiring the inclination data.

18. The method of claim 15, comprising:

a step of moving the fork with the arm and moving the substrate held by the fork in a transverse direction, and a step of inclining the fork with the inclination adjusting mechanism so that a height position of the substrate on a tip end side is lower than a height position there on a rear end side when seen in a transport direction of the substrate, in order to suppress movement of the substrate from a preset holding position due to an inertial force acting on the substrate in the step of moving the substrate in the transverse direction.

* * * * *